United States Patent
Hanawa et al.

(10) Patent No.: US 10,699,920 B2
(45) Date of Patent: Jun. 30, 2020

(54) SUBSTRATE TREATING METHOD AND SUBSTRATE TREATING APPARATUS

(71) Applicant: SCREEN Holdings Co., Ltd., Kyoto (JP)

(72) Inventors: Yosuke Hanawa, Kyoto (JP); Yuta Sasaki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 16/251,138

(22) Filed: Jan. 18, 2019

(65) Prior Publication Data

US 2019/0295865 A1    Sep. 26, 2019

(30) Foreign Application Priority Data

Mar. 22, 2018  (JP) ................. 2018-055027

(51) Int. Cl.
| | |
|---|---|
| *H01L 21/67* | (2006.01) |
| *H01L 21/68* | (2006.01) |
| *H01L 21/677* | (2006.01) |
| *B08B 3/00* | (2006.01) |
| *B08B 3/04* | (2006.01) |

(52) U.S. Cl.
CPC ......... *H01L 21/67034* (2013.01); *B08B 3/00* (2013.01); *B08B 3/04* (2013.01); *H01L 21/6715* (2013.01); *H01L 21/67028* (2013.01); *H01L 21/67051* (2013.01); *H01L 21/67075* (2013.01); *H01L 21/67109* (2013.01); *H01L 21/67248* (2013.01); *H01L 21/67739* (2013.01); *H01L 21/68* (2013.01)

(58) Field of Classification Search
None
See application file for complete search history.

(56) References Cited

U.S. PATENT DOCUMENTS

| | | | |
|---|---|---|---|
| 2013/0008868 A1 | 1/2013 | Uozumi et al. | 216/41 |
| 2017/0062244 A1 | 3/2017 | Sato et al. | |
| 2017/0345683 A1* | 11/2017 | Sasaki | B08B 3/02 |

FOREIGN PATENT DOCUMENTS

| | | |
|---|---|---|
| JP | 2012-204451 A | 10/2012 |
| JP | 2012-243869 A | 12/2012 |
| JP | 2013-016699 A | 1/2013 |
| JP | 2013-258272 A | 12/2013 |
| JP | 2015-130542 A | 7/2015 |
| JP | 2017-45850 A | 3/2017 |

(Continued)

*Primary Examiner* — Jiong-Ping Lu
(74) *Attorney, Agent, or Firm* — Ostrolenk Faber LLP

(57) ABSTRACT

Disclosed is a substrate treating method comprising: a supply step of supplying a process liquid including a drying auxiliary substance in a melted state to a pattern formation surface of a substrate; a solidification step of solidifying the process liquid on the pattern formation surface so as to from a solidified body; and a removal step of removing the solidified body from the pattern formation surface, wherein a substance which satisfies at least one of the following conditions, namely a melting entropy under atmospheric pressure at a melting point of 1 mJ/cm³·K or more but 500 mJ/cm³·K or less and a sublimation entropy under atmospheric pressure at 0° C. of 1 mJ/cm³·K or more but 2000 mJ/cm³·K or less, is used as the drying auxiliary substance.

7 Claims, 17 Drawing Sheets

(56) References Cited

FOREIGN PATENT DOCUMENTS

| JP | 2017-103499 A | 6/2017 |
| JP | 2017-103500 A | 6/2017 |
| JP | 2017-224783 A | 12/2017 |
| JP | 2018-182212 A | 11/2018 |

* cited by examiner

SUBSTRATE TREATING METHOD AND SUBSTRATE TREATING APPARATUS

BACKGROUND OF THE INVENTION

Field of the Invention

The present invention relates to a substrate treating apparatus and a substrate treating method which remove, from substrates, liquids adhered to various types of substrates (hereinafter simply referred to as "substrates") such as a semiconductor substrate, a glass substrate for a photomask, a glass substrate for a liquid crystal display, a glass substrate for a plasma display, a FED (Field Emission Display) substrate, a substrate for an optical disc, a substrate for a magnetic disc and a substrate for a magneto-optical disc.

Description of Related Art

In the manufacturing process of an electronic component such as a semiconductor device or a liquid crystal display device, various types of wet processing using liquids are performed on a substrate, and thereafter dry processing for removing the liquids adhered to the substrate by the wet processing is performed on the substrate.

As the wet processing, washing processing which removes contaminants on the surface of the substrate can be mentioned. For example, on the surface of a substrate in which a fine pattern having recesses and projections is formed by a dry etching step, a reaction byproduct (etching residue) is present. In addition to the etching residue, a metal impurity, an organic contaminant and the like may be adhered to the surface of the substrate, and in order to remove these substances, washing processing such as for supplying a washing liquid to the substrate is performed.

After the washing processing, rinse processing which removes the washing liquid with a rinse liquid and dry processing which dries the rinse liquid are performed. As the rinse processing, rinse processing that supplies a rinse liquid such as deionized water (DIW) to the surface of the substrate to which the washing liquid is adhered so as to remove the washing liquid on the surface of the substrate can be mentioned. Thereafter, the dry processing is performed that removes the rinse liquid so as to dry the substrate.

In recent years, as a finer pattern has been formed on a substrate, the aspect ratio of a convex portion in a pattern having recesses and projections (the ratio between the height and the width of the convex portion in the pattern) has been increased. Hence, there is a problem of a so-called pattern collapse in which at the time of dry processing, surface tension that acts on a boundary surface between a liquid such as a washing liquid or a rinse liquid entering a concave portion in the pattern and a gas in contact with the liquid pulls and collapses the adjacent convex portions in the pattern.

As a dry technology for preventing the pattern collapse caused by surface tension as described above, for example, Japanese Unexamined Patent Application Publication No. 2013-16699 discloses a method in which a solution is brought into contact with a substrate where a structure (pattern) is formed such that the solution is changed into a solid, in which the solid is used as a support member (solidified body) for the pattern and in which the support member is removed by being changed from a solid phase to a gas phase without the intervention of a liquid phase. This patent literature also discloses that as the support member, a sublimable substance is used which is at least any of a methacrylic resin material, a styrene resin material and a fluorocarbon material.

Japanese Unexamined Patent Application Publication Nos. 2012-243869 and 2013-258272 disclose drying technologies in which the solution of a drying auxiliary substance is supplied onto a substrate, and a solvent in the solution is dried such that the top of the substrate is filled with the drying auxiliary substance in a solid phase, thereby subliming the drying auxiliary substance. According to these prior art literatures, it is assumed that, since surface tension does not act on a boundary surface between a solid and a gas in contact with the solid, it is possible to inhibit the collapse of a pattern caused by surface tension.

In the drying technologies disclosed in Japanese Unexamined Patent Application Publication Nos. 2013-16699, 2012-243869 and 2013-258272, as compared with previously disclosed technologies, a significant effect of inhibiting the collapse of a pattern can be expected. However, in the case of a fine pattern which is fine and has a high aspect ratio (that is, the height of a convex pattern is greater than the width of the convex pattern), the collapse of the pattern still occurs even when the drying technologies disclosed in these prior art literatures are used. There are various causes for the occurrence of the collapse of the pattern, including a force which acts between the drying auxiliary substance and the surface of the pattern as one example.

Specifically, in a freeze drying (or sublimation drying) method utilizing sublimation, in a drying process of the surface of a substrate, a drying auxiliary substance is changed from a solid state to a gaseous state without undergoing a liquid state. Then, forces such as an ionic bond, a hydrogen bond and a van der Waals' force act on the interface between a pattern surface and the drying auxiliary substance. Hence, during sublimation drying, an uneven phase change (the solidification or the sublimation of the drying auxiliary substance) occurs in the drying auxiliary substance, which leads to stress being applied to the pattern, with the result that the collapse of the pattern occurs. These forces significantly depend on the physical properties of the drying auxiliary substance. Hence, in order to reduce the occurrence of the collapse of a fine pattern caused by sublimation drying, it is necessary to select a drying auxiliary substance suitable for the fine pattern.

BRIEF SUMMARY OF THE INVENTION

The present invention is made in view of the foregoing problem, and has an object to provide a substrate treating method and a substrate treating apparatus which can remove a liquid adhered to the surface of a substrate while preventing the collapse of a pattern formed on the surface of the substrate.

In order to solve the above-mentioned problems, the substrate treating method comprises; a supply step of supplying a process liquid including a drying auxiliary substance in a melted state to a pattern formation surface of a substrate; a solidification step of solidifying the process liquid on the pattern formation surface so as to from a solidified body; and a removal step of removing the solidified body from the pattern formation surface, wherein a substance which satisfies at least one of the following conditions, namely a melting entropy under atmospheric pressure at a melting point of 1 mJ/cm$^3$·K or more but 500 mJ/cm$^3$·K or less and a sublimation entropy under atmospheric pressure at 0° C. of 1 mJ/cm$^3$·K or more but 2000 mJ/cm$^3$·K or less, is used as the drying auxiliary substance.

In the configuration described above, for example, when liquid is present on the pattern formation surface of the substrate, by the principle of freeze drying (or sublimation drying), the liquid can be removed while the collapse of the pattern is prevented. Specifically, in the supply step, the process liquid is supplied to the pattern formation surface of the substrate such that the liquid is replaced with the process liquid. Then, in the solidification step, the process liquid is solidified so as to from the solidified body. Here, by using, as the drying auxiliary substance, a substance which satisfies at least one of the following conditions, namely a melting entropy under atmospheric pressure at the melting point of 1 mJ/cm$^3$·K or more but 500 mJ/cm$^3$·K or less and a sublimation entropy under atmospheric pressure at 0° C. of 1 mJ/cm$^3$·K or more but 2000 mJ/cm$^3$·K or less, it is possible, for example, to reduce the nonuniformity in the development of the sublimation when the drying auxiliary substance is sublimed in the solidified body. In this way, as compared with a case where the sublimation develops nonuniformly, it is possible to reduce stress applied to the pattern of the substrate. Consequently, for example, as compared with a substrate treating method using a conventional drying auxiliary substance, the occurrence of the collapse of the pattern can be reduced, even in a substrate which has a pattern surface having a fine aspect ratio.

Here, the "molten state" means that the sublimable substance melts fully or partially and thereby has fluidity so as to be brought into a liquid state. The "sublimable" means that a single substance, a compound or a mixture has the property of changing its phase from a solid phase to a gas phase or from a gas phase to a solid phase without the intervention of a liquid phase, and the "sublimable substance" means a substance which has the sublimable property described above. The "pattern-formed surface" means a surface of a substrate in which a concave/convex pattern is formed in an arbitrary region regardless of the surface being planar, curved or concave/convex. The "solidified body" means a material obtained by the solidification of a liquid.

In this configuration, the substrate treating method may further comprise an atmosphere control step of placing at least the pattern formation surface of the substrate under a dry inert gas atmosphere or making the dry inert gas flow from the center of the pattern formation surface of the substrate toward a freely-selected peripheral portion, thereby replacing air located on the pattern formation surface with the dry inert gas so as to perform atmosphere control on the pattern formation surface, wherein the atmosphere control step is performed in parallel with the supply step. In this way, by placing the pattern formation surface of the substrate under the dry inert gas atmosphere or by making the dry inert gas flow from the center of the pattern formation surface toward a freely-selected peripheral portion, the process liquid supplied to the pattern formation surface can be prevented from being exposed to air and the like so as to be contaminated. Further, for example, when the process liquid which includes the substance that satisfies the condition wherein the sublimation entropy (under atmospheric pressure at 0° C.) is 1 mJ/cm$^3$·K or more but 2000 mJ/cm$^3$·K or less is used as the drying auxiliary substance, the liquid film of the process liquid is extremely easily evaporated. However, when the pattern formation surface of the substrate is placed under the dry inert gas atmosphere, since the dry inert gas does not flow on the pattern formation surface, the evaporation of the liquid film of the process liquid can be inhibited. Furthermore, it is possible to prevent the collapse of the pattern caused by the flow of the dry inert gas.

In this configuration, the substrate treating method may further comprise a film thinning step of thinning, on the pattern formation surface, a liquid film of the process liquid supplied to the pattern formation surface of the substrate in the supply step, wherein the atmosphere control step is performed in parallel with the film thinning step instead of the supply step or in parallel with the supply step and the film thinning step. In this way, even when the liquid film of the process liquid supplied to the pattern formation surface of the substrate in the supply step is thinned on the pattern formation surface, by placing the pattern formation surface under the dry inert gas atmosphere or by making the dry inert gas flow from the center of the pattern formation surface toward the freely-selected peripheral portion, it is possible to prevent the thin film of the process liquid from being exposed to air and the like so as to be contaminated. In the former case, furthermore, the evaporation of the thin film of the process liquid can be inhibited, and the collapse of the pattern caused by the flow of the dry inert gas can be prevented.

In this configuration, it is preferred that the flow of the dry inert gas from the center of the pattern formation surface of the substrate toward the freely-selected peripheral portion in the atmosphere control step is made to be a laminar flow with a flow rate of 30 l/min or less. When the top of the pattern formation surface of the substrate is placed under the flow of the dry inert gas, by making the dry inert gas flow in a laminar flow state with a flow rate of 30 l/min or less, the evaporation of the thin film of the process liquid can be reduced. It is also possible to reduce the collapse of the pattern caused by the flow of the dry inert gas.

In this configuration, it is preferred that the drying auxiliary substance is one selected from a group consisting of 1, 1, 2, 2, 3, 3, 4-heptafluorocyclopentane, p-xylene, cyclohexane, hexafluorobenzene, dodecafluorocyclohexane and fluorocyclohexane.

In this configuration, it is preferred that the dry inert gas is at least one selected from a group consisting of nitrogen gas, dry air, argon gas and carbon dioxide.

In order to solve the above-mentioned problems, the substrate treating apparatus comprises; a supply means for supplying a process liquid including a drying auxiliary substance in a melted state to a pattern formation surface of a substrate; a solidification means for solidifying the process liquid on the pattern formation surface so as to from a solidified body; and a removal means for removing the solidified body from the pattern formation surface, wherein a substance that satisfies at least one of the following conditions, namely a melting entropy under atmospheric pressure at a melting point of 1 mJ/cm$^3$·K or more but 500 mJ/cm$^3$·K or less and a sublimation entropy at 0° C. of 1 mJ/cm$^3$·K or more but 2000 mJ/cm$^3$·K or less, is used as the drying auxiliary substance.

In the configuration described above, for example, when liquid is present on the pattern formation surface of the substrate, by the principle of freeze drying (or sublimation drying), the liquid can be removed while the collapse of the pattern is prevented. Specifically, the process liquid is supplied to the pattern formation surface of the substrate with the supply means such that the liquid is replaced with the process liquid. Then, the process liquid is solidified with the solidification means so as to from the solidified body. Here, by using, as the drying auxiliary substance, a substance which satisfies at least one of the following conditions, namely a melting entropy under atmospheric pressure at the melting point of 1 mJ/cm$^3$·K or more but 500 mJ/cm$^3$·K or less and a sublimation entropy under atmospheric pressure at 0° C. of 1 mJ/cm$^3$·K or more but 2000 mJ/cm$^3$·K or less, it is possible to reduce the nonuniformity in the development of the sublimation when the drying auxiliary substance is sublimed in the solidified body. In this way, as compared with a case where the sublimation develops nonuniformly, it is possible to reduce stress applied to the pattern of the substrate. Consequently, for example, as compared with a substrate treating apparatus using a conventional drying auxiliary substance, even in a substrate which has a pattern surface having a fine aspect ratio, the occurrence of the collapse of the pattern can be reduced. Further, in the configuration described above, during the supply of the process liquid to the pattern formation surface with the supply means, air located on the pattern formation surface is replaced with the dry inert gas by the atmosphere control means. In this way, the process liquid supplied to the pattern formation surface can be prevented from being exposed to air and the like, and the process liquid can be prevented from becoming contaminated during the supply of the process liquid.

In this configuration, the substrate treating apparatus further may comprise: an atmosphere control means for placing at least the pattern formation surface of the substrate under a dry inert gas atmosphere or making the dry inert gas flow from the center of the pattern formation surface of the substrate toward a freely-selected peripheral portion, thereby replacing air located on the pattern formation surface with the dry inert gas so as to perform atmosphere control on the pattern formation surface, wherein the atmosphere control means performs atmosphere control on the pattern formation surface during the supply of the process liquid by the supply means. In this way, by placing the pattern formation surface of the substrate under the dry inert gas atmosphere or under an environment where the dry inert gas flows from the center of the pattern formation surface toward the freely-selected peripheral portion, it is possible to prevent the process liquid supplied to the pattern formation surface from being exposed to air and the like so as to be contaminated. Further, for example, when the process liquid which includes the substance that satisfies the condition wherein the sublimation entropy (under atmospheric pressure at 0° C.) is 1 mJ/cm$^3$·K or more but 2000 mJ/cm$^3$·K or less is used as the drying auxiliary substance, the liquid film of the process liquid is extremely easily evaporated. However, when the pattern formation surface of the substrate is placed under the dry inert gas by the atmosphere control means, since the dry inert gas does not flow on the pattern formation surface, the evaporation of the liquid film of the process liquid can be inhibited. Furthermore, it is possible to prevent the collapse of the pattern caused by the flow of the dry inert gas.

In this configuration, the substrate treating apparatus may further comprise a film thinning means for thinning a liquid film of the process liquid which is supplied to the pattern formation surface of the substrate with the supply means, wherein the atmosphere control on the pattern formation surface by the atmosphere control means is performed during the thinning of the process liquid by the film thinning means instead of during the supply of the process liquid by the supply means or during the supply of the process liquid by the supply means and during the thinning of the process liquid by the film thinning means. In this way, even when the liquid film of the process liquid supplied to the pattern formation surface of the substrate with the supply means is thinned on the pattern formation surface, by placing the pattern formation surface under the dry inert gas atmosphere or under an environment where the dry inert gas flows from the center of the pattern formation surface toward the freely-selected peripheral portion, it is possible to prevent the thin film of the process liquid from being exposed to air and the like so as to be contaminated. In the former case, furthermore, the evaporation of the thin film of the process liquid can be inhibited, and it is also possible to prevent the collapse of the pattern caused by the flow of the dry inert gas.

In this configuration, it is preferred that the atmosphere control means makes the dry inert gas flow from the center of the pattern formation surface of the substrate toward the freely-selected peripheral portion at a flow rate of 30 l/min or less as a laminar flow. When the top of the pattern formation surface of the substrate is placed under the flow of the dry inert gas with the atmosphere control means, by making the dry inert gas flow in a laminar flow state with a flow rate of 30 l/min or less, it is possible to reduce the evaporation of the thin film of the process liquid. It is also possible to reduce the collapse of the pattern caused by the flow of the dry inert gas.

In this configuration, it is preferred that the drying auxiliary substance is one selected from a group consisting of 1, 1, 2, 2, 3, 3, 4-heptafluorocyclopentane, p-xylene, cyclohexane, hexafluorobenzene, dodecafluorocyclohexane and fluorocyclohexane.

In this configuration, it is preferred that the dry inert gas is at least one selected from a group consisting of nitrogen gas, dry air, argon gas and carbon dioxide.

The present invention provides effects as described below with the means described above.

That is, in the present invention, for example, when liquid is present on the pattern formation surface of a substrate, the liquid is replaced with a process liquid containing a drying auxiliary substance, and after the process liquid is solidified so as to form a solidified body, the drying auxiliary substance in the solidified body is sublimed, and thus, drying processing is performed on the liquid on the substrate. Here, in the present invention, by using, as the drying auxiliary substance, a substance that satisfies at least one of the following conditions, namely a melting entropy under atmospheric pressure at a melting point of 1 mJ/cm$^3$·K or more but 500 mJ/cm$^3$·K or less and a sublimation entropy under atmospheric pressure at 0° C. of 1 mJ/cm$^3$·K or more but 2000 mJ/cm$^3$·K or less, uniformity can be achieved in the development of the sublimation when the drying auxiliary substance is sublimed. In this way, in the present invention, it is possible to reduce the application of stress to the pattern due to the nonuniformity in the development of the sublimation. Consequently, the present invention, as compared with a substrate treating method and a substrate treating apparatus using a conventional drying auxiliary substance, can further reduce the collapse of the pattern, with the result that it is extremely suitable for drying processing of liquid on a substrate.

DETAILED DESCRIPTION OF THE INVENTION (First Embodiment)

A first embodiment of the present invention will be described below.

A substrate treating apparatus according to the present embodiment can be used, for example, for processing on various types of substrates. The "substrates" described above refer to various types of substrates such as a semiconductor substrate, a glass substrate for a photomask, a glass substrate for a liquid crystal display, a glass substrate for a plasma display, a FED (Field Emission Display) substrate, a substrate for an optical disc, a substrate for a magnetic disc and a substrate for a magneto-optical disc. In the present embodiment, a description will be given using, as an example, a case where the substrate treating apparatus 1 is used for processing on a semiconductor substrate (hereinafter referred to as a "substrate").

As an example of the substrate, a substrate is used in which a circuit pattern and the like (hereinafter referred to as a "pattern") are formed on only one main surface. Here, a pattern-formed surface (main surface) on which the pattern is formed is referred to as a "front surface", and a main surface on the opposite side on which the pattern is not formed is referred to as a "back surface". The surface of the substrate which is directed downward is referred to as a "lower surface", and the surface of the substrate which is directed upward is referred to as an "upper surface". A description will be given below with the assumption that the upper surface is the front surface.

The substrate treating apparatus is a single-wafer type substrate treating apparatus which is used in washing processing (including rinse processing) for removing contaminants such as particles adhered to the substrate and dry processing after the washing processing.

<1-1 Configuration of Substrate Treating Apparatus>

The configuration of the substrate treating apparatus according to the present embodiment will first be described with reference to FIGS. 1 and 2.

Figure 1:
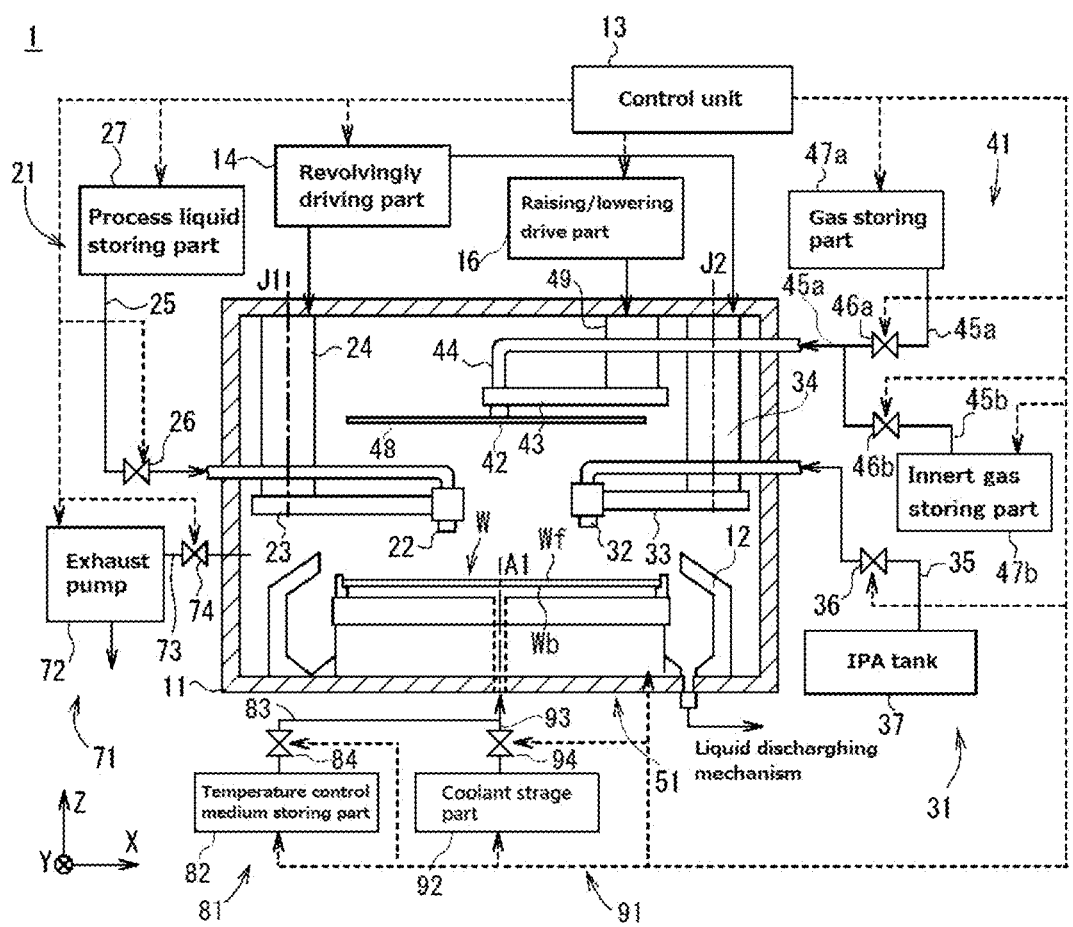
FIG. 1 is an illustrative view schematically showing a substrate treating apparatus according to a first embodiment of the present invention.

FIG. 1 is an illustrative view schematically showing the substrate treating apparatus according to the present embodiment. FIG. 2 is a schematic cross-sectional view schematically showing a substrate holding means in the substrate treating apparatus. In FIG. 1, in order to clarify the directional relation of what is shown in the figures, XYZ orthogonal coordinate axes are shown as necessary. In the figure, an XY plane indicates a horizontal plane, and a +Z direction indicates a vertically upward direction.

As shown in FIG. 1, the substrate treating apparatus 1 includes at least a chamber 11 which is a container which stores the substrate W, a substrate holding means 51 which holds the substrate W, a control unit 13 which controls the individual portions of the substrate treating apparatus 1, a process liquid supply means (supply means) 21 which supplies a process liquid to the front surface Wf of the substrate W, an IPA supply means 31 which supplies IPA to the front surface Wf of the substrate W, a gas supply means (solidification means, sublimation means, atmosphere control means) 41 which supplies a gas to the front surface Wf of the substrate W, a scattering prevention cup 12 which collects the IPA, the process liquid and the like, a revolvingly driving part 14 which individually and independently turns and drives the respective arms that will be described later, a raising/lowering drive part 16 which raises and lowers, in an up/down direction, an interruption plate that will be described later, a pressure reduction means (sublimation means) 71 which reduces the pressure within the chamber 11, a temperature control means 81 which controls the temperature of the process liquid within a predetermined range, and a coolant supply means (solidification means, sublimation means) 91 which supplies a coolant to the back surface Wb of the substrate W. The substrate treating apparatus 1 also includes a substrate loading/unloading means, a chuck pin opening/closing mechanism and a wet washing means (all of which are not illustrated). The individual portions of the substrate treating apparatus 1 will be described below. Although only portions used in drying processing are shown and a washing nozzle used in the washing processing and the like are not shown in FIG. 1, the substrate treating apparatus 1 may include the nozzle and the like.

Figure 2:
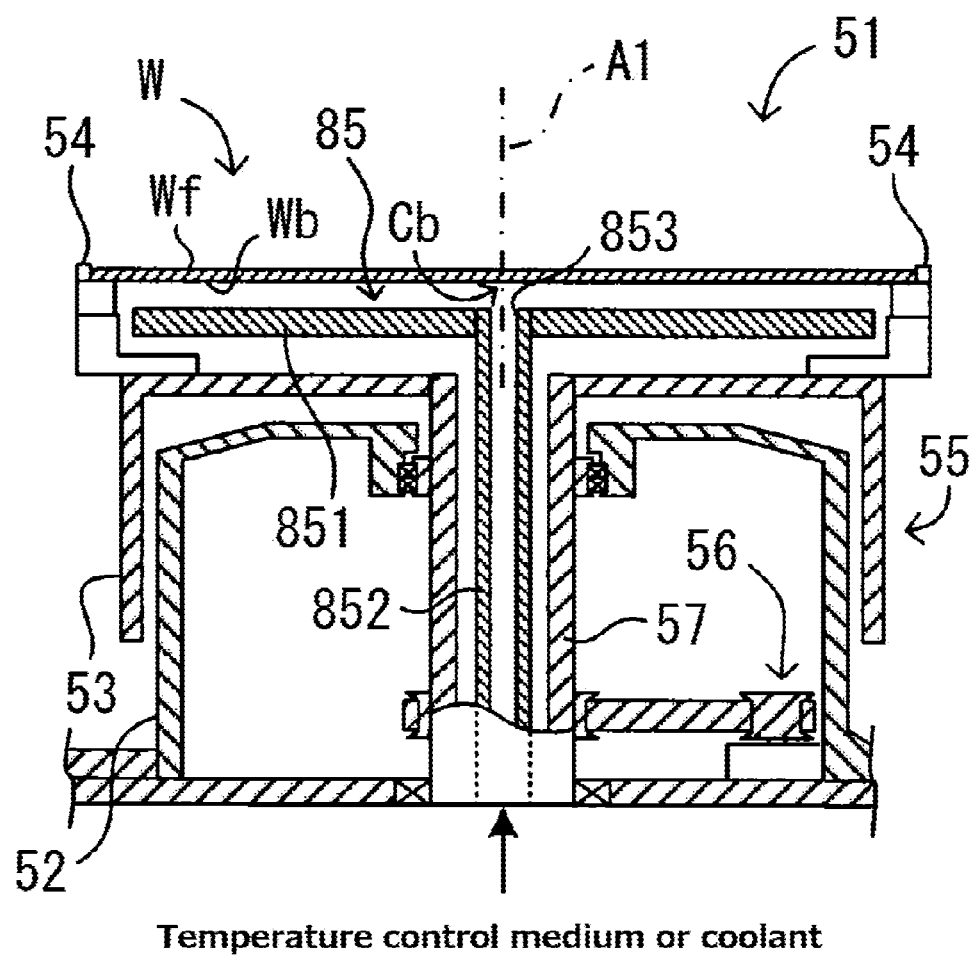
FIG. 2 is a schematic cross-sectional view schematically showing a substrate holding means in the substrate treating apparatus.

The substrate holding means 51 is a means which holds the substrate W, and, as shown in FIG. 2, holds the substrate W in a substantially horizontal posture in a state where the front surface Wf of the substrate is directed upward and rotates the substrate W. The substrate holding means 51 includes a spin chuck 55 in which a spin base 53 and a rotation support shaft 57 are integrally combined. The spin base 53 is formed substantially in the shape of a circle in plan view, and the hollow rotation support shaft 57 which is extended in a substantially vertical direction is fixed to the center portion of the spin base 53. The rotation support shaft 57 is coupled to the rotation shaft of a chuck rotation mechanism 56 which includes a motor. The chuck rotation mechanism 56 is stored within a cylindrical casing 52, and the rotation support shaft 57 is rotatably supported about the rotation shaft in the vertical direction by the casing 52.

The chuck rotation mechanism 56 rotates the rotation support shaft 57 about the rotation shaft by drive from a chuck drive portion (unillustrated) in the control unit 13. In this way, the spin base 53 attached to an upper end portion of the rotation support shaft 57 is rotated about the rotation shaft. The control unit 13 controls the chuck rotation mechanism 56 through the chuck drive portion, and thereby can adjust the rotation speed of the spin base 53.

In the vicinity of the peripheral portion of the spin base 53, a plurality of chuck pins 54 for grasping the peripheral end portion of the substrate W are provided so as to stand. Although the number of chuck pins 54 installed is not particularly limited, at least three or more chuck pins 54 are preferably provided in order to reliably hold the circular substrate W. In the present embodiment, along the peripheral portion of the spin base 53, three chuck pins 54 are arranged at equal intervals. Each of the chuck pins 54 includes a substrate support pin which supports the peripheral portion of the substrate W from below and a substrate hold pin which presses the outer circumferential end surface of the substrate W supported by the substrate support pin so as to hold the substrate W.

Each of the chuck pins 54 can be switched between a pressed state where the substrate hold pin presses the outer circumferential end surface of the substrate W and a released state where the substrate hold pin is separated from the outer circumferential end surface of the substrate W, and the switching of the states is performed according to an operation instruction from the control unit 13 which controls the entire device. More specifically, when the substrate W is loaded or unloaded with respect to the spin base 53, the individual chuck pins 54 are brought into the released state whereas when substrate processing to be described later from the washing processing to sublimation processing is performed on the substrate W, the individual chuck pins 54 are brought into the pressed state. When the chuck pin 54 is brought into the pressed state, the chuck pin 54 grasps the peripheral portion of the substrate W such that the substrate W is held in a horizontal posture (XY plane) a predetermined distance apart from the spin base 53. In this way, the substrate W is held horizontally in a state where its front surface Wf is directed upward. A method of holding the substrate W is not limited to this method, and for example, the back surface Wb of the substrate W may be held by an adsorption method with a spin chuck or the like.

In a state where the substrate W is held by the spin chuck 55, more specifically, in a state where the peripheral portion of the substrate W is held by the chuck pins 54 provided on the spin base 53, the chuck rotation mechanism 56 is operated, and thus the substrate W is rotated about the rotation shaft A1 in the vertical direction.

The process liquid supplying unit (supplying unit) 21 is a unit which supplies the process liquid (dry assistant liquid) to the pattern-formed surface of the substrate W held in the substrate holder 51, and includes, as shown in FIG. 1, at least a nozzle 22, an arm 23, a turning shaft 24, a pipe 25, a valve 26 and a process liquid storing part 27.

The nozzle 22 is attached to the tip end portion of the arm 23 which is provided so as to be extended horizontally, and is arranged above the spin base 53. The back end portion of the arm 23 is rotatably supported about an axis J1 by the turning shaft 24 which is provided so as to be extended in the Z direction, and the turning shaft 24 is provided so as to be fixed within the chamber 11. The arm 23 is coupled via the turning shaft 24 to the revolvingly driving part 14. The revolvingly driving part 14 is electrically connected to the control unit 13, and rotates the arm 23 about the axis J1 by an operation instruction from the control unit 13. As the arm 23 is rotated, the nozzle 22 is also moved. The nozzle 22 is normally located outside the peripheral portion of the substrate W, and is arranged in a retraction position further outside the scattering prevention cup 12. When the arm 23 is rotated by operation instruction of the control unit 13, the nozzle 22 is arranged in a position above the center portion (the axis A1 or the vicinity thereof) of the front surface Wf of the substrate W.

Figure 3A:
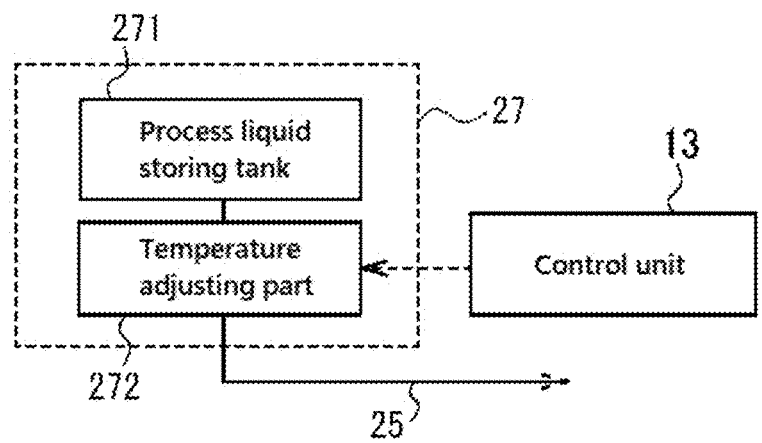
FIG. 3A is a block diagram showing a schematic configuration of a process liquid storage portion.
Figure 3B:
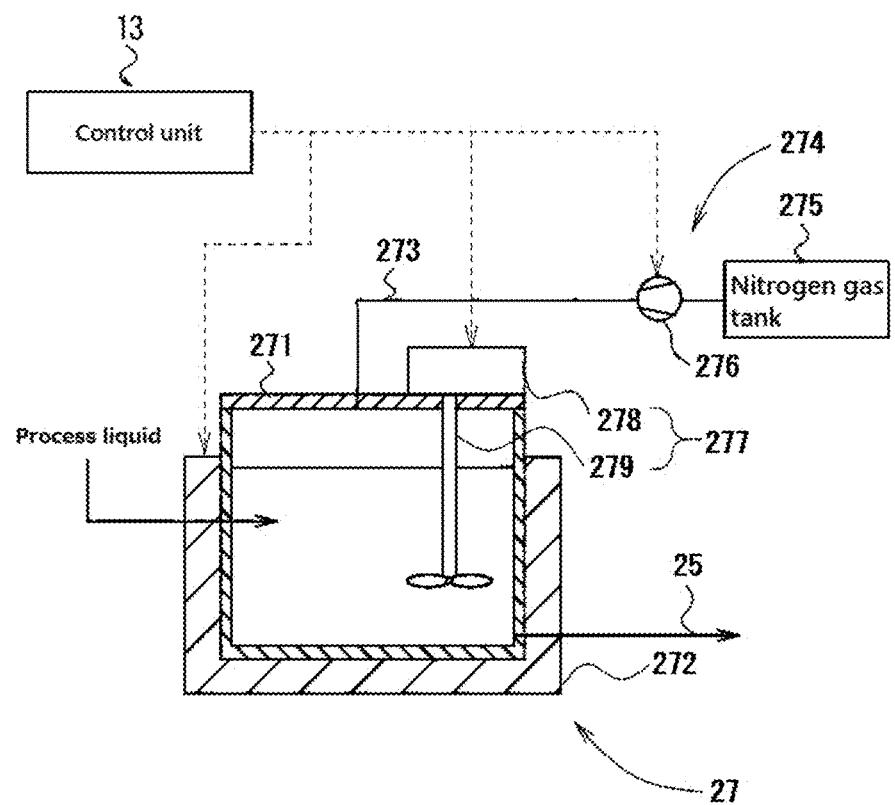
FIG. 3B is an illustrative view showing a specific configuration of the process liquid storage portion.

As shown in FIGS. 3A and 3B, the process liquid storing part 27 includes at least a process liquid storing tank 271, an agitation part 277 which agitates the process liquid within the process liquid storing tank 271, a pressurization part 274 which pressurizes the process liquid storing tank 271 so as to feed out the process liquid and a temperature adjusting part 272 which heats the process liquid within the process liquid storing tank 271. FIG. 3A is a block diagram showing a schematic configuration of the process liquid storing part 27, and FIG. 3B is an illustrative diagram showing a specific configuration of the process liquid storing part 27.

The agitation part 277 includes a rotation part 279 which agitates the process liquid within the process liquid storing tank 271 and an agitation control part 278 which controls the rotation of the rotation part 279. The agitation control part 278 is electrically connected to the control unit 13. The rotation part 279 has a propeller-shaped agitation blade at a tip end of the rotation shaft (the lower end of the rotation part 279 in FIG. 3B), the control unit 13 provides an operation instruction to the agitation control part 278 such that the rotation part 279 is rotated, and thus the process liquid is agitated by the agitation blade, with the result that the concentration and temperature of a dry auxiliary substance and the like in the process liquid are made uniform.

The method of making the concentration and temperature of the process liquid within the process liquid storing tank 271 uniform is not limited to the method described above, and a known method such as a method of additionally providing a circulation pump to circulate the process liquid can be used.

The pressurization part 274 is formed with a nitrogen gas tank 275 which is the supply source of a gas for pressurizing the interior of the process liquid storing tank 271, a pump 276 which pressurizes nitrogen gas and a pipe 273. The nitrogen gas tank 275 is connected through the pipe 273 with the pipeline to the process liquid storing tank 271, and the pump 276 is interposed in the pipe 273.

The temperature control portion 272 is electrically connected to the control unit 13, and heats, by operation instruction of the control unit 13, the process liquid stored in the process liquid storage tank 271 so as to perform temperature control. The temperature control is sufficiently performed such that the temperature of the process liquid is equal to or higher than the melting point of a drying auxiliary substance contained in the process liquid. In this way, it is possible to maintain the melted state of the drying auxiliary substance in the process liquid. The upper limit of the temperature control is preferably a temperature which is lower than the boiling point of the drying auxiliary substance. The temperature control portion 272 is not particularly limited, and for example, a known temperature control mechanism can be used such as a resistance heater, a Peltier element or a pipe through which temperature-controlled water runs. In the present embodiment, the configuration of the temperature control portion 272 is freely selected. For example, when an environment in which the substrate treating apparatus 1 is installed is an environment whose temperature is higher than the melting point of the drying auxiliary substance, since it is possible to maintain the melted state of the drying auxiliary substance, it is not necessary to heat the process liquid. Consequently, the temperature control portion 272 can be omitted.

The process liquid storing part 27 (more specifically, the process liquid storing tank 271) is connected through the pipe 25 with the pipeline to the nozzle 22, and the valve 26 is interposed partway through the path of the pipe 25.

An air pressure sensor (unillustrated) is provided within the process liquid storing tank 271, and is electrically connected to the control unit 13. The control unit 13 controls, based on a value detected by the air pressure sensor, the operation of the pump 276 so as to keep the air pressure within the process liquid storing tank 271 at a predetermined air pressure higher than atmospheric pressure. On the other hand, the valve 26 is also electrically connected to the control unit 13, and is normally closed. The opening and closing of the valve 26 is also controlled by the operation instruction of the control unit 13. When the control unit 13 provides the operation instruction to the process liquid supplying unit 21 so as to open the valve 26, the process liquid is fed by pressure from the interior of the process liquid storing tank 271 which is pressurized, and is discharged through the pipe 25 from the nozzle 22. In this way, it is possible to supply the process liquid to the front surface Wf of the substrate W. Since the process liquid storing tank 271 uses, as described above, the pressure caused by the nitrogen gas to feed the process liquid, the process liquid storing tank 271 is preferably configured so as to be airtight.

As shown in FIG. 1, the IPA supply means 31 is a unit which supplies the IPA (isopropyl alcohol) to the substrate W held in the substrate holding means 51, and includes a nozzle 32, an arm 33, a turning shaft 34, a pipe 35, a valve 36 and an IPA tank 37.

The nozzle 32 is attached to the tip end portion of the arm 23 which is provided so as to be extended horizontally, and is arranged above the spin base 53. The back end portion of the arm 33 is rotatably supported about an axis J2 by the turning shaft 34 which is provided so as to be extended in the Z direction, and the turning shaft 34 is provided so as to be fixed within the chamber 11. The arm 33 is coupled via the turning shaft 34 to the revolvingly driving part 14. The revolvingly driving part 14 is electrically connected to the control unit 13, and rotates the arm 33 about the axis J2 by operation instruction from the control unit 13. As the arm 33 is rotated, the nozzle 32 is also moved. The nozzle 32 is normally located outside the peripheral portion of the substrate W, and is arranged in a retraction position outside the scattering prevention cup 12. When the arm 33 is rotated by operation instruction of the control unit 13, the nozzle 32 is arranged in a position above the center portion (the axis A1 or the vicinity thereof) of the front surface Wf of the substrate W.

The valve 36 is electrically connected to the control unit 13, and is normally closed. The opening and closing of the valve 36 is controlled by the operation instruction of the control unit 13. When the valve 36 is opened by the operation instruction of the control unit 13, the IPA is passed through the pipe 35 and is supplied from the nozzle 32 to the front surface Wf of the substrate W.

The IPA tank 37 is pipeline-connected via the pipe 35 to the nozzle 32, and the valve 36 is interposed partway through the path of the pipe 35. IPA is stored in the IPA tank 37, and IPA within the IPA tank 37 is pressurized by an unillustrated pump, feeding IPA from the pipe 35 in the direction of the nozzle 32.

Although IPA is used in the IPA supply means 31 in the present embodiment, as long as a liquid which is soluble in the drying auxiliary substance and deionized water (DIW) is used, there is no limitation to the IPA in the present invention. Examples of alternatives to IPA in the present embodiment include methanol, ethanol, acetone, benzene, carbon tetrachloride, chloroform, hexane, decalin, tetralin, acetic acid, cyclohexanol, ether and hydrofluoroether (Hydro Fluoro Ether).

As shown in FIG. 1, the gas supply means 41 is a unit which supplies a gas to the substrate W held in the substrate holding means 51, and includes a nozzle 42, an arm 43, a support shaft 44, pipes 45a and 45b, valves 46a and 46b, a gas storing part 47a, a dry inert gas storing part 47b, an interruption plate 48 and a raising/lowering mechanism 49.

Figure 4A:
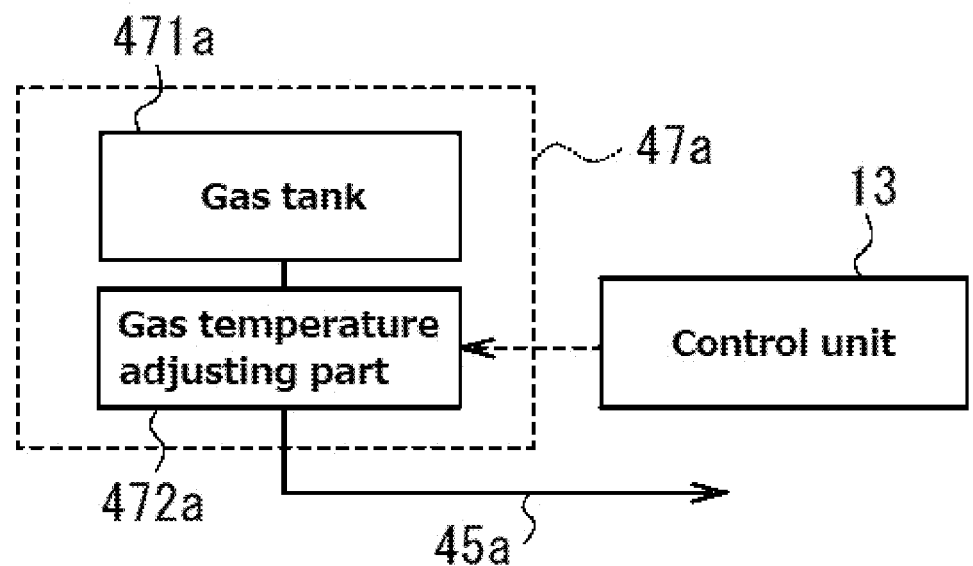
FIG. 4A is a block diagram showing a schematic configuration of a gas storing part in the substrate treating apparatus.

As shown in FIG. 4A, the gas storing part 47a includes a gas tank 471a which stores a gas and a gas temperature control portion 472a which controls the temperature of the gas stored in the gas tank 471a. FIG. 4A is a block diagram showing a schematic configuration of the gas storing part 47a. The gas temperature control portion 472a is electrically connected to the control unit 13, and heats or cools the gas stored in the gas tank 471a by operation instruction of the control unit 13 so as to perform temperature control. The gas temperature control portion 472a is not particularly limited, and for example, a known temperature control mechanism can be used such as a Peltier element or a pipe through which temperature-controlled water runs.

As shown in FIG. 1, the gas storing part 47a (more specifically, the gas tank 471a) is pipeline-connected via the pipe 45a to the nozzle 42, and the valve 46a is interposed partway through the path of the pipe 45a. The gas within the gas storing part 47a is pressurized by an unillustrated pressurization means so as to be fed to the pipe 45a. Since the pressurization means can be realized by pressurization with a pump or the like or by compressing and storing the gas into the gas storing part 47a, any pressurization means may be used.

The valve 46a is electrically connected to the control unit 13, and is normally closed. The opening and closing of the valve 46a is controlled by operation instruction of the control unit 13. When the valve 46a is opened by operation instruction of the control unit 13, the nitrogen gas stored in the gas tank 471a is passed through the pipe 45a and is discharged from the nozzle 42.

The nozzle 42 is provided at the tip end of the support shaft 44. The support shaft 44 is held at the tip end portion of the arm 43 which is provided so as to be extended in a horizontal direction. In this way, the nozzle 42 is arranged above the spin base 53, and is more specifically arranged in a position above the center portion (the axis A1 or the vicinity thereof) of the front surface Wf of the substrate W.

The arm 43 is provided so as to be extended substantially in the horizontal direction, and the back end portion thereof is supported by the raising/lowering mechanism 49. The arm 43 is connected via the raising/lowering mechanism 49 to the raising/lowering drive part 16. The raising/lowering drive part 16 is electrically connected to the control unit 13, and raises and lowers the raising/lowering mechanism 49 in the up/down direction by operation instruction from the control unit 13 such that the arm 43 is also raised and lowered integrally. In this way, the nozzle 42 and the interruption plate 48 can be moved close to the spin base 53 or can be separated therefrom. Specifically, the nozzle 42 and the interruption plate 48 are raised to a separation position (position indicated in FIG. 1) above the spin chuck 55 when the control unit 13 controls the operation of the raising/lowering mechanism 49 to load the substrate W into and unload the substrate W from the substrate treating apparatus 1, whereas the nozzle 42 and the interruption plate 48 are lowered to such a height position that a clearance set against the front surface Wf of the substrate W is provided when the atmosphere control step, the solidification step or the like which will be described later is performed. The raising/lowering mechanism 49 is provided so as to be fixed within the chamber 11.

The support shaft 44 is formed substantially in the shape of a hollow cylinder, and a gas supply pipe (unillustrated) is inserted therewithin. The gas supply pipe communicates with the pipe 45a. In this way, the nitrogen gas stored in the gas storing part 47a can be made to flow through the gas supply pipe. The nozzle 42 for discharging an inert gas such as nitrogen gas is connected to the tip end of the gas supply pipe.

The interruption plate 48 is formed in the shape of a disc which has an opening in a center portion and which has a freely-selected thickness, and is attached to the lower end portion of the support shaft 44 substantially horizontally. The lower surface of the interruption plate 48 is a substrate opposite surface which is opposite the front surface Wf of the substrate W, and is substantially parallel to the front surface Wf of the substrate W. The interruption plate 48 is formed so as to have such a size that its diameter is equal to or larger than the diameter of the substrate W. Furthermore, the interruption plate 48 is provided such that the nozzle 42 is located in its opening. The interruption plate 48 can be rotated synchronously with the rotation of the substrate W when the atmosphere control step, the solidification step, a removal step or the like which will be described later is performed. The rotation of the interruption plate 48 is enabled by the control unit 13 controlling the operation of the raising/lowering mechanism 49.

In the gas tank 471a, an inert gas which is inert to at least the drying auxiliary substance, more specifically, nitrogen gas, is stored. The nitrogen gas can be used in the solidification step or the removal step which will be described later. The nitrogen gas is controlled in the gas temperature control portion 472a such that its temperature is equal to or lower than the freezing point of the drying auxiliary substance. Although the temperature of the nitrogen gas is not particularly limited as long as the temperature is equal to or higher than the freezing point of the drying auxiliary substance, the temperature of the nitrogen gas can be normally set within a range which is 0° C. or higher but 15° C. or lower. By setting the temperature of the nitrogen gas to be 0° C. or higher, it is possible to prevent water vapor present within the chamber 11 from becoming solidified and adhered to the front surface Wf of the substrate W, with the result that it is possible to prevent the substrate W from being adversely affected.

The nitrogen gas used in the present embodiment is preferably a dry gas whose dew point is 0° C. or lower. When the nitrogen gas is sprayed to a solidified body under an atmospheric pressure environment, the drying auxiliary substance in the solidified body is sublimed into the nitrogen gas. Since the nitrogen gas is continuously supplied to the solidified body, the partial pressure in the nitrogen gas of the drying auxiliary substance in a gaseous state is maintained to be lower than the saturated vapor pressure of the drying auxiliary substance in the gaseous state at the temperature of the nitrogen gas, and thus, at least the surface of the solidified body is filled with an atmosphere in which the drying auxiliary substance in the gaseous state is present at the saturated vapor pressure or less.

Although nitrogen gas is used as the gas stored in the gas storing part 47a in the present embodiment, as long as the gas is inert to the drying auxiliary substance, there is no limitation to the gas in the practice of the present invention. Examples of alternatives to nitrogen gas in the first embodiment include argon gas, helium gas and air (gas having a nitrogen gas concentration of 80% and an oxygen gas concentration of 20%). Alternatively, a mixture gas obtained by mixing a plurality of types of gases described above may be used.

Figure 4B:
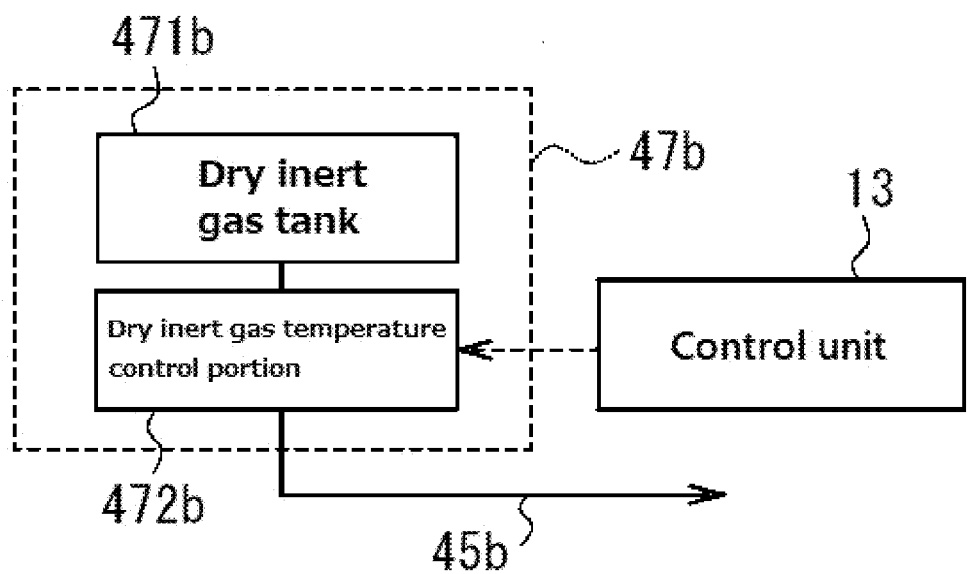
FIG. 4B is a block diagram showing a schematic configuration of a dry inert gas storing part.

As shown in FIG. 4B, the dry inert gas storing part 47b includes a dry inert gas tank 471b which stores a dry inert gas and a dry inert gas temperature control portion 472b which controls the temperature of the dry inert gas stored in the dry inert gas tank 471b. FIG. 4B is a block diagram showing a schematic configuration of the dry inert gas storing part 47b. The dry inert gas temperature control portion 472b is electrically connected to the control unit 13, and heats or cools the dry inert gas stored in the dry inert gas tank 471b by operation instruction of the control unit 13 so as to perform temperature control. The dry inert gas temperature control portion 472b is not particularly limited, and for example, a known temperature control mechanism can be used such as a Peltier element or a pipe through which temperature-controlled water runs.

As shown in FIG. 1, the dry inert gas storing part 47*b* (more specifically, the dry inert gas tank 471*b*) communicates such that the pipe 45*b* is combined with the pipe 45*a*, and is thereby pipeline-connected to the nozzle 42 via the pipe 45*a* and the pipe 45*b*. Furthermore, the valve 46*b* is interposed partway through the path of the pipe 45*b*. The gas within the dry inert gas storing part 47*b* is pressurized by an unillustrated pressurization means so as to be fed to the pipe 45*b*. Since the pressurization means can be realized by pressurization with a pump or the like or by compressing and storing the dry inert gas in the dry inert gas storing part 47*b*, any pressurization means may be used.

The valve 46*b* is electrically connected to the control unit 13, and is normally closed. The opening and closing of the valve 46*b* is controlled by operation instruction of the control unit 13. When the valve 46*b* is opened by operation instruction of the control unit 13, the dry inert gas stored in the dry inert gas tank 471*b* is passed through the pipe 45*b* and the pipe 45*a* and is discharged from the nozzle 42.

In the dry inert gas tank 471*b*, the dry inert gas which is inert to at least the drying auxiliary substance is stored. The dry inert gas can be used in the atmosphere control step which will be described later. The temperature of the dry inert gas is controlled by the dry inert gas temperature control portion 472*b* so as to be higher than at least the freezing point of the dry inert gas which is used. The temperature of the dry inert gas is normally set as necessary within a range higher than the freezing point of the drying auxiliary substance used but 50° C. or lower. By setting the temperature of the dry inert gas to be higher than the freezing point of the drying auxiliary substance used, it is possible to prevent the process liquid on the front surface Wf of the substrate W from becoming solidified.

There is no particular limitation to the dry inert gas stored in the dry inert gas storing part 47*b* as long as the gas is a dry gas inert to the drying auxiliary substance. The examples of the dry inert gas described above includes at least one selected from a group consisting of nitrogen gas, dry air (gas having a nitrogen gas concentration of 80% and an oxygen gas concentration of 20%), argon gas, and carbon dioxide gas. The "dry inert gas" refers to a gas in which the amount of water contained in the dry inert gas is 1000 ppm or less, preferably 100 ppm or less, and more preferably 10 ppm or less. By setting the amount of water in the dry inert gas to be 1000 ppm or less, it is possible to prevent the dew condensation of the process liquid on the front surface Wf caused by the cooling of the substrate W in the solidification step and the removal step.

The gas supply means 41 may be configured so as to incorporate the process liquid supply means. In this case, the nozzle 22 of the process liquid supply means is provided at the tip end of the support shaft 44 so as to be present together with the nozzle 42 for discharging an inert gas or the like. A supply pipe (unillustrated) for supplying the process liquid is also inserted into the support shaft 44, and the supply pipe communicates with the pipe 25. In this way, the process liquid stored in the process liquid storage portion 27 can be made to flow through the supply pipe.

As shown in FIG. 1, the pressure reducing unit 71 is a means which reduces the interior of the chamber 11 in pressure to an environment lower than atmospheric pressure, and includes an exhaust pump 72, a pipe 73 and a valve 74. The exhaust pump 72 is a known pump which is connected through the pipe 73 with the pipeline to the chamber 11 and which applies pressure to the gas. The exhaust pump 72 is electrically connected to the control unit 13, and is normally in a stop state. The drive of the exhaust pump 72 is controlled by the operation instruction of the control unit 13. The valve 74 is interposed in the pipe 73. The valve 74 is electrically connected to the control unit 13, and is normally closed. The opening and closing of the valve 74 is controlled by the operation instruction of the control unit 13.

When the exhaust pump 72 is driven by the operation instruction of the control unit 13, and the valve 74 is opened, the gas present within the chamber 11 is exhausted by the exhaust pump 72 through the pipe 73 to the outside of the chamber 11.

The scattering prevention cup 12 is provided so as to surround the spin base 53. The scattering prevention cup 12 is connected to an unillustrated raising/lowering mechanism so as to be able to be raised and lowered in the Z direction. When the process liquid and the IPA are supplied to the pattern-formed surface of the substrate W, the scattering prevention cup 12 is located by the raising/lowering mechanism in a predetermined position as shown in FIG. 1 so as to surround, from lateral positions, the substrate W held by the chuck pins 54. In this way, it is possible to collect liquids such as the process liquid and the IPA scattered from the substrate W and the spin base 53.

Figure 5:
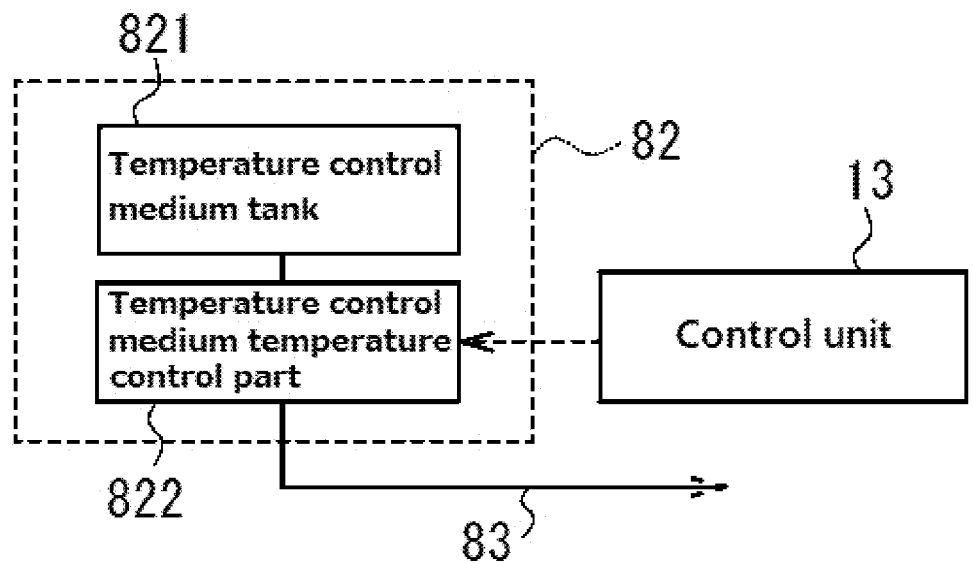
FIG. 5 is a block diagram showing a schematic configuration of a temperature control means in the substrate treating apparatus.

The temperature control means 81 is a unit which controls the temperature of the process liquid supplied to the front surface Wf of the substrate W, and includes, as shown in FIGS. 1, 2 and 5, at least a temperature control medium storing part 82, a pipe 83, a valve 84 and a temperature control medium supply portion 85. FIG. 5 is a block diagram showing a schematic configuration of the temperature control medium storing part 82.

As shown in FIG. 5, the temperature control medium storing part 82 includes a temperature control medium tank 821 which stores a temperature control medium and a temperature control medium temperature control part 822 which controls the temperature of the temperature control medium stored in the temperature control medium tank 821.

The temperature control medium temperature control part 822 is electrically connected to the control unit 13, and heats or cools the temperature control medium stored in the temperature control medium tank 821 by operation instruction of the control unit 13 so as to perform temperature control. The temperature control is suitably performed such that the temperature control medium stored in the temperature control medium tank 821 falls within a temperature range which is equal to or higher than the melting point of the drying auxiliary substance but equal to or lower than the boiling point thereof. The temperature control medium temperature control part 822 is not particularly limited, and for example, a known temperature control mechanism can be used such as chiller using a Peltier element or a pipe through which temperature-controlled water runs.

The temperature control medium storing part 82 is pipeline-connected via the pipe 83 to the supply pipe 852 which will be described later, and the valve 84 is interposed partway through the path of the pipe 83. The temperature control medium within the temperature control medium storing part 82 is pressurized by an unillustrated pressurization means so as to be fed to the pipe 83. Since the pressurization means can be realized by pressurization with a pump or the like or by compressing and storing the gas in the temperature control medium storing part 82, any pressurization means may be used.

The valve 84 is electrically connected to the control unit 13, and is normally closed. The opening and closing of the valve 84 is controlled by the operation instruction of the control unit 13. When the valve 84 is opened by the operation instruction of the control unit 13, the temperature control medium is passed through the pipe 83 and the supply pipe 852 and is supplied to the back surface Wb of the substrate W.

The temperature control medium supply part 85 is provided below the substrate W supported by the spin chuck 55 in a horizontal posture. As shown in FIG. 2, the temperature control medium supply part 85 includes at least an opposite member 851 whose horizontal upper surface is arranged opposite the lower surface Wb of the substrate, the supply pipe 852 which is attached to the center portion of the opposite member 851 and which is extended downward in the vertical direction and a discharge portion 853 which discharges the temperature control medium in a fluid state toward the back surface Wb of the substrate W.

The opposite member 851 has a disc-shaped external form whose area is smaller than the substrate W. The opposite member 851 is provided so as to be separated only an arbitrary distance apart from the substrate W. The separation distance between the opposite member 851 and the substrate W is not particularly limited, and is preferably set as necessary so as to be filled with the temperature control medium.

The supply pipe 852 is inserted through the center portion of the hollow rotation support shaft 57. The discharge portion 853 is opened, in the supply pipe 852, toward the center portion Cb of the lower surface Wb of the substrate, and discharges the temperature control medium supplied from the temperature control medium storage part 82 toward the lower surface Wb of the substrate. The area of the opening of the discharge portion 853 is not particularly limited, and can be set as necessary with consideration given to the discharged amount and the like. The supply pipe 852 is not connected to the rotation support shaft 57, and thus even when the spin chuck 55 is rotated, the discharge portion 853 is prevented from being rotated. The supply pipe 852 has, as will be described later, the function of supplying a coolant for cooling the back surface Wb of the substrate W, and the discharge portion 853 has the function of discharging the coolant.

The temperature control medium is not particularly limited as long as the temperature control medium is a liquid or a gas whose melting point is equal to or above that of the dry auxiliary substance and whose boiling point is equal to or below that of the dry auxiliary substance and has no activity against the dry auxiliary substance. For example, as the liquid, water and the like can be mentioned. For example, as the gas, an inert gas such as nitrogen gas and the like can be mentioned.

The coolant supplying unit 91 is a unit which supplies the coolant to the back surface Wb of the substrate W, and forms parts of the solidifying unit and the sublimating unit in the present invention. More specifically, as shown in FIG. 1, the coolant supplying unit 91 includes at least a coolant storage part 92, a pipe 93 and a valve 94.

Figure 6:
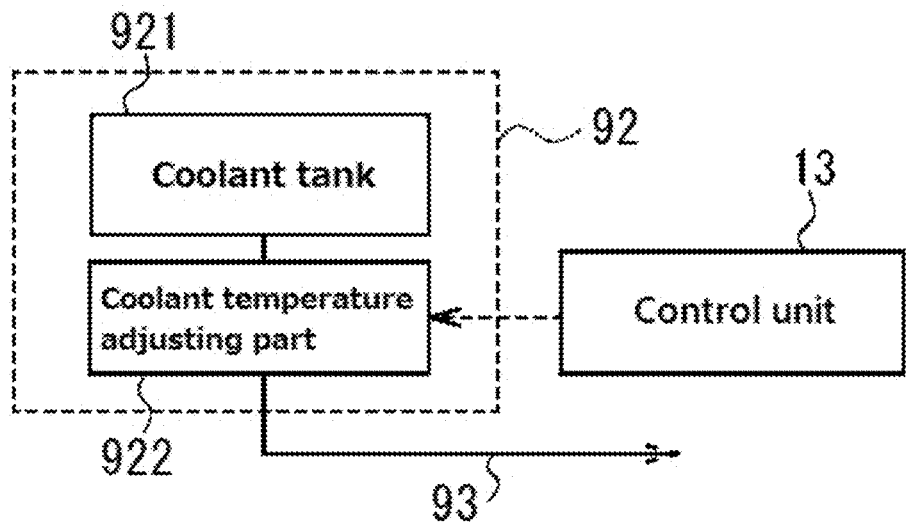
FIG. 6 is a block diagram showing a schematic configuration of a coolant supply means in the substrate treating apparatus.

As shown in FIG. 6, the coolant storage part 92 includes a coolant tank 921 in which the coolant is stored and a coolant temperature adjusting part 922 which adjusts the temperature of the coolant stored in the coolant tank 921. FIG. 6 is a block diagram showing a schematic configuration of the coolant storage part 92.

The coolant temperature adjusting part 922 is electrically connected to the control unit 13, and heats or cools the coolant stored in the coolant tank 921 by the operation instruction of the control unit 13 so as to perform temperature adjustment. The temperature adjustment is preferably performed such that the coolant stored in the coolant tank 921 has a low temperature which is equal to or below the freezing point of the dry auxiliary substance. The coolant temperature adjusting part 922 is not particularly limited, and for example, a known temperature adjustment mechanism can be used such as a chiller using a Peltier element or a pipe through which water whose temperature is adjusted is passed.

The coolant storage part 92 is connected through the pipe 93 with the pipeline to the supply pipe 852, and the valve 94 is interposed partway through the path of the pipe 93. The coolant within the coolant storage part 92 is pressurized by an unillustrated pressurization unit so as to be fed to the pipe 93. Since the pressurization unit can be realized by pressurization with a pump or the like or by compressing and storing the gas into the coolant storage part 92, any pressurization unit may be used. Another supply pipe for supplying the coolant to the back surface Wb of the substrate W may be provided separately of the supply pipe 852. In this case, a discharge portion for discharging the coolant is also preferably provided in the supply pipe.

The valve 94 is electrically connected to the control unit 13, and is normally closed. The opening and closing of the valve 94 is controlled by the operation instruction of the control unit 13. When the valve 94 is opened by the operation instruction of the control unit 13, the coolant is supplied through the pipe 93 and the supply pipe 852 to the back surface Wb of the substrate W.

As the coolant, a liquid or a gas whose temperature is equal to or below the freezing point of the dry auxiliary substance can be mentioned. Furthermore, the liquid is not particularly limited, and for example, cold water having a temperature of 7° C. or the like can be mentioned. The gas is not particularly limited, and for example, an inert gas which is inert to the dry auxiliary substance, more specifically, nitrogen gas having a temperature of 7° C. or the like can be mentioned.

Figure 7:
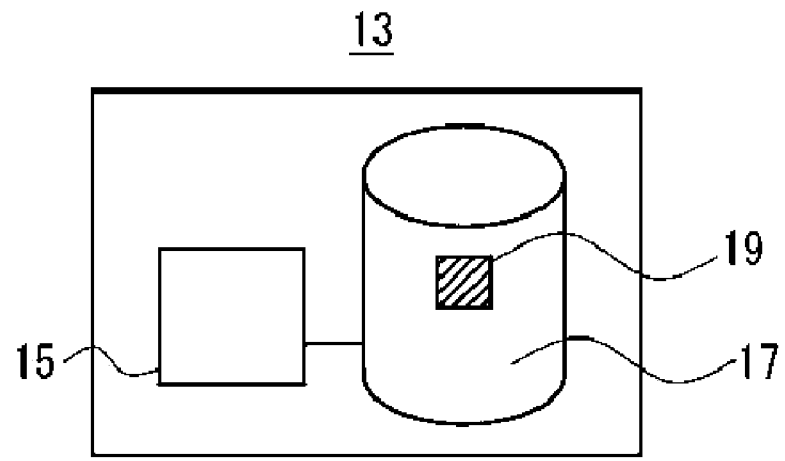
FIG. 7 is an illustrative view showing a schematic configuration of a control unit in the substrate treating apparatus.

The control unit 13 is electrically connected to the individual portions of the substrate treating apparatus 1 (see FIG. 1), and controls the operations of the individual portions. As shown in FIG. 7, the control unit 13 is formed with a computer which includes a computation processing part 15 and a memory 17. FIG. 7 is a schematic view showing the configuration of the control unit 13. The memory 17 includes a ROM which is a read-only memory that stores a substrate processing program 19, a RAM which is a readable and writable memory that stores various types of information, and a magnetic disc which stores control software, data and the like. In the magnetic disc, substrate processing conditions (recipes) corresponding to the substrate W are previously stored. The CPU reads the substrate processing conditions on the RAM so as to control the individual portions of the substrate treating apparatus 1 according to the details thereof <1-2 Process Liquid>

Next, the process liquid used in the present embodiment will be described below. The process liquid of the present invention contains at least the drying auxiliary substance in the melted state, and functions, in drying processing for removing liquid present on the pattern formation surface of the substrate, as a dry auxiliary liquid for assisting the drying processing. The process liquid may also be formed of the drying auxiliary substance in the melted state.

The drying auxiliary substance has the property of changing its phase from a solid to a gas or from a gas to a solid without undergoing a liquid phase, and has at least any one of following physical properties of (1) and (2):

(1) A melting entropy at the melting point of the drying auxiliary substance under atmospheric pressure is 1 mJ/cm$^3$·K or more but 500 mJ/cm$^3$·K or less, and preferably 1 mJ/cm$^3$·K or more but 400 mJ/cm$^3$·K or less.

(2) A sublimation entropy at 0° C. under atmospheric pressure is 1 mJ/cm$^3$·K or more but 2000 mJ/cm$^3$·K or less.

Furthermore, in the present embodiment, the drying auxiliary substance preferably satisfies both the physical values of (1) and (2) described above. The "under atmospheric pressure" described herein is not limited to the case of 1 atmospheric pressure (about 0.1 MPa) or below, and includes the case of a range of 0.7 atmospheric pressure (about 0.07 MPa) to 1.3 atmospheric pressure (0.13 MPa) or below. By using a drying auxiliary substance whose melting entropy is 500 mJ/cm$^3$·K or less and/or whose sublimation entropy is 2000 mJ/cm$^3$·K or less, it is possible to inhibit nonuniformity in the development of the sublimation of the drying auxiliary substance in the solidified body so as to reduce the collapse of the pattern. For example, for a pattern wherein, a plurality of cylinders (aspect ratio of 20) having a diameter of 28 nm and a height of 560 nm are arranged at intervals of 80 nm on the substrate, the collapse rate of the pattern can be suppressed to 50% or less. Furthermore, in a drying auxiliary substance whose melting entropy is 400 mJ/cm$^3$·K or less and/or whose sublimation entropy is 2000 mJ/cm$^3$·K or less, the collapse rate of the pattern can be suppressed to 20% or less.

The collapse rate of the pattern is a value which is calculated by a formula below.

collapse rate of a pattern (%)=(the number of convex portions collapsed in a freely-selected region)/(the total number of convex portions in the region)×100

Furthermore, as for the drying auxiliary substance, its vapor pressure in a liquid state at room temperature is preferably 100 Pa or more, more preferably 1115 Pa or more, and further preferably 5680 Pa or more. By using the drying auxiliary substance whose vapor pressure is 100 Pa or more, it is possible to further reduce the collapse of the pattern. In the present specification, "room temperature" means that the temperature falls within a temperature range of 5 to 35° C.

The type of drying auxiliary substance is not particularly limited as long as the substance satisfies at least any one of the physical properties of (1) and (2) described above. Specifically, for example, it includes one selected from a group consisting of 1, 1, 2, 2, 3, 3, 4-heptafluorocyclopentane (melting point of 20.5° C., vapor pressure of 8200 Pa (25° C.), melting entropy of 0.087 J/cm$^3$·K (1 atm, melting point), sublimation entropy of 1.005 J/cm$^3$·K (1 atm, 0° C.)), p-xylene (melting point of 13.4° C., vapor pressure of 1114 Pa (25° C.), melting entropy of 0.479 J/cm$^3$·K (1 atm, melting point), sublimation entropy of 2.007 J/cm$^3$·K (1 atm, 0° C.)), cyclohexane (melting point of 6.68° C., vapor pressure of 13018 Pa (25° C.), melting entropy of 0.089 J/cm$^3$·K (1 atm, melting point), sublimation entropy of 1.209 J/cm$^3$·K (1 atm, 0° C.)), hexafluorobenzene (melting point of 5.7 to 5.8° C., vapor pressure of 11238 Pa (25° C.), melting entropy of 0.36 J/cm$^3$·K (1 atm, melting point), sublimation entropy of 1.761 J/cm$^3$·K (1 atm, 0° C.)), dodecafluorocyclohexane (melting point of 51° C., vapor pressure of 33103.7 Pa (25° C.), melting entropy of 0.144 J/cm$^3$·K (1 atm, melting point), sublimation entropy of 0.748 J/cm$^3$·K (1 atm, 0° C.)) and fluorocyclohexane (melting point of 13° C., vapor pressure of 5679.1 Pa (25° C.), melting entropy of 0.082 J/cm$^3$·K (1 atm, melting point), sublimation entropy of 1.25 J/cm$^3$·K (1 atm, 0° C.)).

The process liquid may be formed only of the drying auxiliary substance in the melted state, but may further contain an organic solvent. In this case, the content of the drying auxiliary substance is preferably 60 mass % or more in the total mass of the process liquid, and more preferably 95 mass % or more. The organic solvent is not particularly limited as long as it is compatible with the drying auxiliary substance in the melted state. Specifically, for example, it includes alcohols.

<1-3 Substrate Treating Method>

Figure 8:
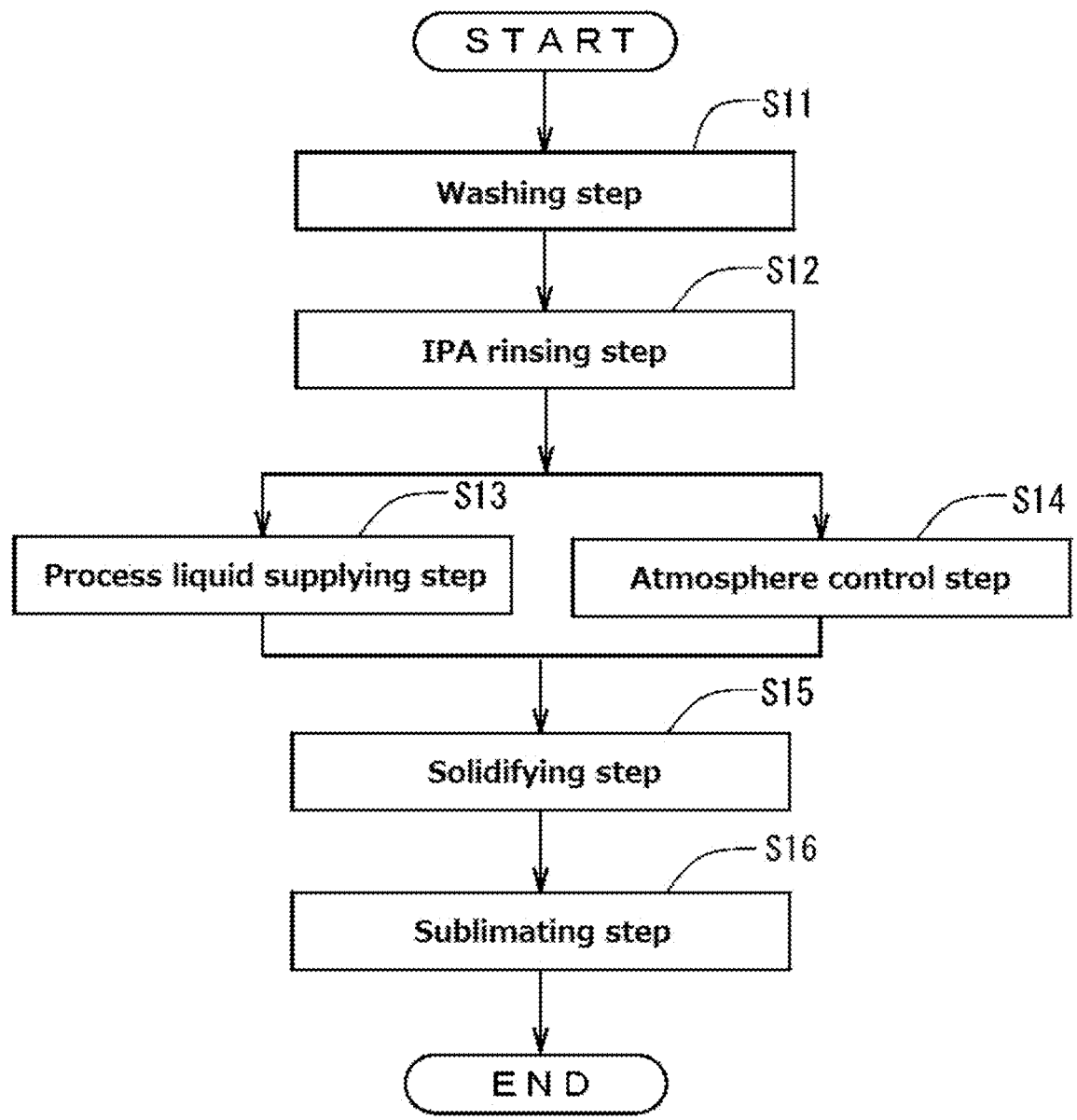
FIG. 8 is a flowchart showing a substrate treating method using the substrate treating apparatus.
Figure 9:
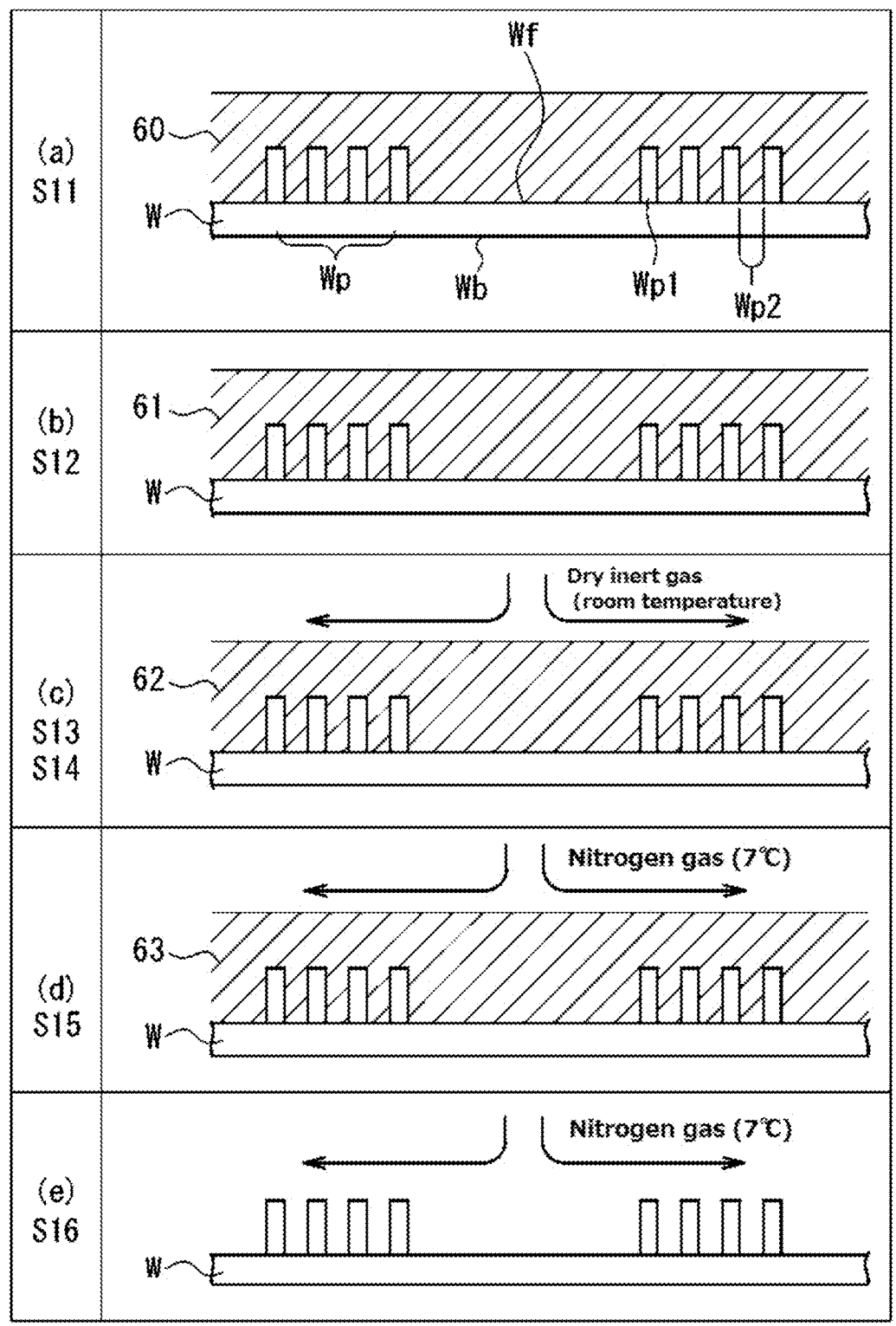
FIG. 9 is a diagram showing the state of a substrate in each step of the substrate treating method.
Figure 10:
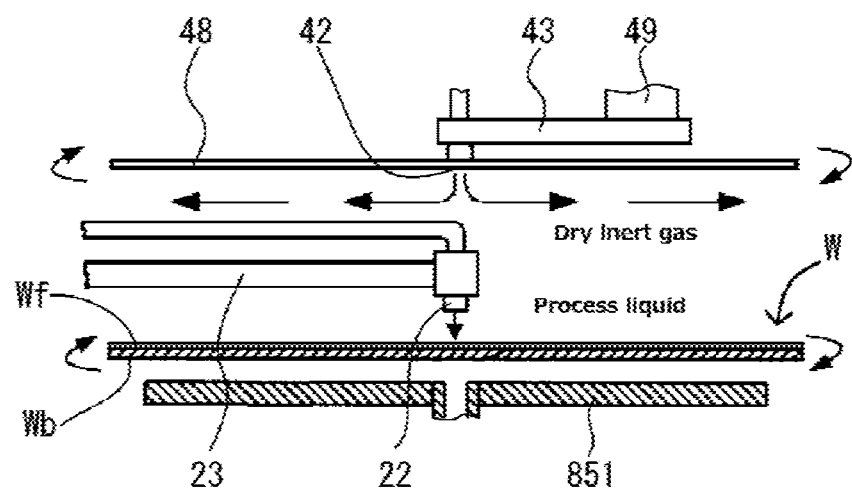
FIG. 10 is a schematic view illustrating an operation of the substrate treating apparatus in a process liquid supply step and an atmosphere control step of the substrate treating method.

A substrate treating method using the substrate treating apparatus 1 of the present embodiment will then be described below with reference to FIGS. 8 to 10. FIG. 8 is a flowchart showing the operation of the substrate treating apparatus 1 according to the first embodiment. FIG. 9 is a schematic view showing the state of the substrate W in individual steps of FIG. 8. FIG. 10 is a schematic view showing the states of a supplying step and an atmosphere control step. On the substrate W, a concave/convex pattern Wp is formed in the preceding step. The pattern Wp includes convex portions Wp1 and concave portions Wp2. In the present embodiment, the height of the convex portion Wp1 falls within a range of 100 to 600 nm, and the width thereof falls within a range of 10 to 50 nm. The shortest distance between two adjacent convex portions Wp1 (the shortest width of the concave portions Wp2) falls within a range of 10 to 50 nm. The aspect ratio of the convex portion Wp1, that is, a value (height/width) obtained by dividing the height by the width falls within a range of 10 to 20.

Unless otherwise explicitly specified, (a) to (e) shown in FIG. 9 are processed under the atmospheric pressure environment. Here, the atmospheric pressure environment refers to an environment of 0.7 to 1.3 atmospheres with the standard atmospheric pressure (1 atmosphere, 1013 hPa) in the center. In particular, when the substrate treating apparatus 1 is arranged within a clean room having a positive pressure, the environment of the front surface Wf of the substrate W is higher than 1 atmosphere.

An operator first provides an instruction to perform a substrate processing program 19 corresponding to a predetermined substrate W. Thereafter, as a preparation for loading the substrate W into the substrate treating apparatus 1, the operation instruction is provided by the control unit 13 so as to perform the following operation. Specifically, the rotation of the chuck rotation mechanism 56 is stopped, and the chuck pins 54 are located in positions suitable for receiving and delivering the substrate W. The valves 26, 36, 46a, 46b, 74, 84 and 94 are closed, and the nozzles 22, 32 and 42 are respectively located in the retraction positions. Then, the chuck pins 54 are brought into an opened state by an unillustrated opening/closing mechanism.

When the unprocessed substrate W is loaded into the substrate treating apparatus 1 by an unillustrated substrate loading/unloading mechanism and is placed on the chuck pins 54, the chuck pins 54 are brought into a closed state by the unillustrated opening/closing mechanism.

After the unprocessed substrate W is held by the substrate holder 51, a washing step S11 is performed on the substrate by an unillustrated wet washing unit. The washing step S11 includes rinse processing for supplying a washing liquid to the front surface Wf of the substrate W so as to perform washing and then removing the washing liquid. The washing liquid is not particularly limited, and for example, SC-1 (liquid containing ammonia, a hydrogen peroxide solution and water), SC-2 (liquid containing hydrochloric acid, a hydrogen peroxide solution and water) and the like can be mentioned. The rinse liquid is not particularly limited, and for example, DIW and the like can be mentioned. The amounts of washing liquid and rinse liquid supplied are not particularly limited, and can be set as necessary according to the range which is washed and the like. The washing time is not particularly limited, and can be set as necessary.

In the present embodiment, the wet washing unit is used, thus the SC-1 is supplied to the front surface Wf of the substrate W so as to wash the front surface Wf and thereafter the DIW is further supplied to the front surface Wf so as to remove the SC-1.

(a) shown in FIG. 9 shows a state of the substrate W when the washing step S11 is completed. As shown in the figure, the DIW (represented by "60" in the figure) supplied in the washing step S11 is adhered to the front surface Wf of the substrate W on which the pattern Wp is formed.

An IPA rinsing step S12 of supplying the IPA to the front surface Wf of the substrate W on which the DIW 60 is adhered is performed (see FIG. 8). The control unit 13 first provides the operation instruction to the chuck rotation mechanism 56 such that the substrate W is rotated about the axis A1 at a constant speed.

Then, the control unit 13 provides the operation instruction to the revolvingly driving part 14 such that the nozzle 32 is located in the center portion of the front surface Wf of the substrate W. Then, the control unit 13 provides the operation instruction to the valve 36 such that the valve 36 is opened. In this way, the IPA is supplied from the IPA tank 37 through the pipe 35 and the nozzle 32 to the front surface Wf of the substrate W.

The IPA supplied to the front surface Wf of the substrate W is made to flow from around the center of the front surface Wf of the substrate W toward the peripheral portion of the substrate W by centrifugal force generated by the rotation of the substrate W so as to be diffused over the entire front surface Wf of the substrate W. In this way, the DIW adhered to the front surface Wf of the substrate W is removed by the supply of the IPA, and thus the entire front surface Wf of the substrate W is covered with the IPA. The rotation speed of the substrate W is preferably set such that the thickness of the film formed of the IPA is higher than the height of the convex portions Wp1 on the entire front surface Wf. The amount of IPA supplied is not particularly limited, and can be set as necessary.

After the completion of the IPA rinsing step S12, the control unit 13 provides the operation instruction to the valve 36 such that the valve 36 is closed. The control unit 13 also provides the operation instruction to the revolvingly driving part 14 such that the nozzle 32 is located in the retraction position.

(b) shown in FIG. 9 shows a state of the substrate W when the IPA rinsing step S12 is completed. As shown in the figure, on the front surface Wf of the substrate W on which the pattern Wp is formed, the IPA (represented by "61" in the figure) supplied in the IPA rinsing step S12 is adhered, and the DIW 60 is replaced by the IPA 61 so as to be removed from the front surface Wf of the substrate W.

Then, a process liquid supply step (supply step) S13 is performed that supplies the process liquid serving as the dry auxiliary liquid containing the drying auxiliary substance in the melted state to the front surface Wf of the substrate W to which the IPA 61 is adhered. In parallel with the process liquid supply step S13, the atmosphere control step S14 of replacing air located on the front surface Wf of the substrate W with a dry inert gas and placing the liquid film of the process liquid supplied to the front surface Wf under a dry inert gas atmosphere is performed (see FIG. 8). In the present specification, "under a dry inert gas atmosphere" means being under an atmosphere filled with only the dry inert gas.

In the process liquid supply step S13, as shown in FIG. 10, the control unit 13 first provides operation instruction to the chuck rotation mechanism 56 such that the substrate W is rotated about the axis A1 at a constant speed. FIG. 10 is a schematic view for illustrating the operation of the substrate treating apparatus in the process liquid supply step S13 and the atmosphere control step S14. Here, the rotation speed of the substrate W is preferably set such that the thickness of the liquid film formed of the process liquid is higher than the height of the convex portions Wp1 on the entire front surface Wf.

Then, the control unit 13 provides operation instruction to the revolvingly driving part 14 such that the nozzle 22 is positioned in the center portion of the front surface Wf of the substrate W. The control unit 13 then provides operation instruction to the valve 26 such that the valve 26 is opened. In this way, the process liquid is supplied from the process liquid storage tank 271 through the pipe 25 and the nozzle 22 to the front surface Wf of the substrate W. The process liquid supplied to the front surface Wf of the substrate W is made to flow from around the center of the front surface Wf of the substrate W toward the peripheral portion of the substrate W by centrifugal force generated by the rotation of the substrate W so as to be diffused over the entire front surface Wf of the substrate W. In this way, the IPA adhered to the front surface Wf of the substrate W is removed by the supply of the process liquid such that the entire front surface Wf of the substrate W is covered with the process liquid, with the result that the liquid film of the process liquid is formed.

The temperature of the supplied process liquid is, at least after the process liquid is supplied to the front surface Wf of the substrate W, set within a range equal to or higher than the melting point of the drying auxiliary substance but lower than the boiling point thereof. For example, when 1, 1, 2, 2, 3, 3, 4-heptafluorocyclopentane (boiling point of 82.5° C.) is used as the drying auxiliary substance, the temperature is preferably set within a range equal to or higher than 35° C. but equal to or lower than 82° C. In this way, it is possible to form, on the front surface Wf of the substrate W, the liquid film 62 made of the process liquid. The amount of process liquid supplied is not particularly limited and can be set as necessary.

As described above, by supplying the process liquid which is brought into a state of a high temperature equal to or higher than the melting point, the solidified body can be formed after the liquid film of the process liquid is formed. Consequently, a solidified body which is formed in the shape of a film with a uniform layer thickness can be obtained, the occurrence of unevenness in drying cam be reduced. When the temperature of the substrate W and the atmosphere temperature within the chamber 11 are equal to or lower than the melting point of the drying auxiliary substance, if the process liquid with a temperature slightly exceeding the melting point is supplied to the substrate W, the process liquid may be solidified in a very short period of time after making contact with the substrate W. In such a case, the solidified body with a uniform layer thickness cannot be formed, and it becomes difficult to reduce unevenness in drying. Hence, when the temperature of the substrate W and the atmosphere temperature within the chamber 11 are equal to or lower than the melting point of the drying auxiliary substance, temperature control is preferably performed such that the liquid temperature of the process liquid is sufficiently higher than the melting point.

On the other hand, in the atmosphere control step S14, since the control unit 13 provides operation instruction also to the raising/lowering drive part 16, the raising/lowering mechanism 49 lowers the nozzle 42 and the interruption plate 48 such that a clearance between them and the front surface Wf of the substrate W reaches a preset value, with the result that the nozzle 42 and the interruption plate 48 are moved close to the substrate W. After the nozzle 42 and the interruption plate 48 are moved close in relation to the front surface Wf of the substrate W up to the preset clearance, the control unit 13 rotates the interruption plate 48 about the axis A1 at a constant speed such that the interruption plate 48 is synchronous with the substrate W.

Then, the control unit 13 provides operation instruction to the valve 46b such that the valve 46b is opened. In this way, the dry inert gas (room temperature) is supplied from the dry inert gas tank 471b through the pipes 45b and 45a and the nozzle 42 to the front surface Wf of the substrate W (see FIG. 10). Here, since the substrate W and the interruption plate 48 are rotated synchronously with each other, the dry inert gas flows in a laminar flow state from around the center of the front surface Wf of the substrate W toward the peripheral portion of the substrate W by centrifugal force generated by the rotation so as to be diffused over the entire front surface Wf of the substrate W. Consequently, air present on the front surface Wf of the substrate W can be replaced with the dry inert gas. Then, by replacing the air with the dry inert gas, the liquid film 62 of the process liquid supplied to the front surface Wf is placed under the flow of the dry inert gas, and thus the liquid film 62 is prevented from being exposed to the air and the like, with the result that it is possible to prevent the liquid film 62 of the process liquid becoming contaminated. Since the interruption plate 48 is arranged close to the front surface Wf of the substrate W, a space formed by the front surface Wf and the interruption plate 48 is interrupted from the outside. Hence, the influence of disturbance received from the external atmosphere is reduced, and the space formed by the front surface Wf of the substrate W and the interruption plate 48 can be filled with a high concentration of dry inert gas.

The flow rate of the dry inert gas is preferably 30 l/min or lower, more preferably 0 to 20 l/min, and further preferably 0 to 10 l/min. By setting the flow rate of the dry inert gas is set to be 30 l/min or lower, it is possible to reduce the collapse of the pattern caused by spraying of the drying auxiliary substance. Even when a substance which has a sublimation entropy 2000 $mJ/cm^3 \cdot K$ or less so as to be extremely easily evaporated is used as the drying auxiliary substance, the evaporation of the drying auxiliary substance can be further inhibited. Furthermore, the liquid film 62 of the process liquid can also be prevented from becoming deformed due to a large amount of dry inert gas being discharged.

On the completion of the process liquid supply step S13, the control unit 13 provides operation instruction to the valve 26 such that the valve 26 is closed. The control unit 13 also provides operation instruction to the revolvingly driving part 14 such that the nozzle 22 is positioned in the retraction position. On the completion of the atmosphere control step S14, the control unit 13 also provides operation instruction to the valve 46b such that the valve 46b is closed. Furthermore, the control unit 13 provides operation instruction to the raising/lowering drive part 16 such that the raising/lowering mechanism 49 is used to raise the nozzle 42 and the interruption plate 48, separating the nozzle 42 and the interruption plate 48 from the front surface Wf of the substrate W.

The atmosphere control step S14 can be started by opening the valve 46b simultaneously with the start of the process liquid supply step S13. Here, "the start of the process liquid supply step S13" means the time when the valve 26 is opened in the process liquid supply means 21. The atmosphere control step S14 may also be started during the process liquid supply step S13, for example, after a freely-selected time has elapsed since the start of the supply of the process liquid. Alternatively, the atmosphere control step S14 may be started after the completion of the IPA rinse step S12 and before the process liquid supply step S13.

The atmosphere control step S14 can be completed by closing the valve 46b simultaneously with the completion of the process liquid supply step S13. Here, "the completion of the process liquid supply step S13" means the time when the valve 26 is closed in the process liquid supply means 21. The atmosphere control step S14 may be completed during the process liquid supply step S13, for example, after a freely-selected time has elapsed since the start of the supply of the process liquid. Alternatively, the atmosphere control step S14 may be completed after the completion of the process liquid supply step S13 and before the start of the removing step S15.

(c) shown in FIG. 9 shows a state of the substrate W when the process liquid supply step S13 and the atmosphere control step S14 are completed. As shown in the figure, the process liquid supplied in the process liquid supply step S13 is adhered to the front surface Wf of the substrate W on which the pattern Wp is formed so as to form the liquid film 62, and the IPA 61 is replaced by the process liquid so as to be removed from the front surface Wf of the substrate W. The liquid film 62 of the process liquid on the front surface Wf of the substrate W is under the dry inert gas atmosphere without evaporating, and is prevented from becoming contaminated.

Then, as shown in FIG. 8, the solidification step S15 of solidifying the process liquid supplied to the front surface Wf of the substrate W so as to form a solidified film of the drying auxiliary substance is performed. The control unit 13 first provides operation instruction to the chuck rotation mechanism 56 such that the substrate W is rotated about the axis A1 at a constant speed. Here, the rotation speed of the substrate W is set such that the process liquid can form, on the entire front surface Wf, the liquid film 62 which has a predetermined film thickness higher than the convex portions Wp1.

Then, the control unit 13 provides operation instruction to the revolvingly driving part 14 such that the nozzle 42 is positioned in the center portion of the front surface Wf of the substrate W. Then, the control unit 13 provides operation instruction to the valve 46a such that the valve 46a is opened. In this way, the gas (in the present embodiment, nitrogen gas of 7° C.) is supplied from the gas tank 47a through the pipe 45a and the nozzle 42 toward the front surface Wf of the substrate W.

The nitrogen gas supplied toward the front surface Wf of the substrate W is made to flow from around the center of the front surface Wf of the substrate W toward the direction of the peripheral portion of the substrate W by centrifugal force generated by the rotation of the substrate W so as to be diffused over the entire front surface Wf of the substrate W covered with the liquid film 62 of the process liquid. In this way, the liquid film 62 of the process liquid formed on the front surface Wf of the substrate W is cooled to a low temperature which is equal to or lower than the freezing point of the drying auxiliary substance so as to be solidified, with the result that the solidified body is formed.

(d) shown in FIG. 9 shows a state of the substrate W when the solidification step S15 is completed. As shown in the figure, the liquid film 62 formed of the process liquid is cooled by the supply of the nitrogen gas of 7° C. so as to be solidified, with the result that a solidified body 63 containing the drying auxiliary substance is formed.

Then, as shown in FIG. 8, the removal step S16 of subliming the solidified body 63 formed on the front surface Wf of the substrate W so as to remove the solidified body 63 from the front surface Wf of the substrate W is then performed. In the removal step S16, the removal is performed while the supply of cold water to the back surface Wb of the substrate W with the coolant supply means 91 is continued. In this way, the solidified body 63 can be cooled to a temperature equal to or lower than the freezing point of the drying auxiliary substance, and the drying auxiliary substance can be prevented from unintentionally melting from the side of the back surface Wb of the substrate W during the removal step.

In the removal step S16, the control unit 13 first provides operation instruction to the chuck rotation mechanism 56 such that the substrate W is rotated about the axis A1 at a constant speed.

Then, the control unit 13 provides operation instruction to the revolvingly driving part 14 such that the nozzle 42 is positioned in the center portion of the front surface Wf of the substrate W. Then, the control unit 13 provides operation instruction to the valve 46a such that the valve 46a is opened. In this way, the gas (in the present embodiment, nitrogen gas of 7° C.) is supplied from the gas tank 471a through the pipe 45a and the nozzle 42 toward the front surface Wf of the substrate W.

Here, the partial pressure of the vapor of the drying auxiliary substance in the nitrogen gas is set lower than the saturated vapor pressure of the drying auxiliary substance at the supply temperature of the nitrogen gas. Hence, by supplying the nitrogen gas described above the front surface Wf of the substrate W so as to make contact with the solidified body 63, the drying auxiliary substance is sublimed from the solidified body 63 into the nitrogen gas. Since the nitrogen gas has a temperature lower than the melting point of the drying auxiliary substance, it is possible to sublime the solidified body 63 while preventing the solidified body 63 from becoming melted.

In this way, by the sublimation of the drying auxiliary substance in a solid state, when the substance such as the IPA present on the front surface Wf of the substrate W is removed, surface tension is prevented from acting on the pattern Wp, and the front surface Wf of the substrate W can be dried satisfactorily while inhibiting the collapse of the pattern.

(e) shown in FIG. 9 shows a state of the substrate W when the removal step S16 is completed. As shown in the figure, the solidified body 63 of the drying auxiliary substance formed in the solidification step S15 is sublimed by the supply of the nitrogen gas of 7° C. so as to be removed from the front surface Wf, with the result that the drying of the front surface Wf of the substrate W is completed.

After the completion of the removal step S16, the control unit 13 provides operation instruction to the valve 46a such that the valve 46a is closed.

In this way, the series of substrate drying processing steps are completed. After the substrate drying processing as described above, the substrate W on which the drying processing has been performed is unloaded from the chamber 11 by the unillustrated substrate loading/unloading mechanism.

As described above, in the present embodiment, by using, as the drying auxiliary substance, a substance that satisfies at least one of the following conditions, namely a melting entropy (under atmospheric pressure, melting point) of 1 mJ/cm$^3$·K or more but 500 mJ/cm$^3$·K or less and a sublimation entropy (under atmospheric pressure, 0° C.) of 1 mJ/cm$^3$·K or more but 2000 mJ/cm$^3$·K or less, it is possible to reduce nonuniform development of sublimation when the drying auxiliary substance is sublimed in the solidified body. Consequently, application of stress to the pattern can be prevented, and the collapse of the pattern on the substrate can be reliably inhibited as compared with conventional substrate drying.

Further, in the present embodiment, by placing the liquid film of the process liquid supplied to the front surface Wf of the substrate W under the dry inert gas atmosphere, it is possible to prevent the liquid film of the process liquid from becoming contaminated. Furthermore, by setting the flow rate of the dry inert gas to be 30 l/min or less when the liquid film of the process liquid is placed under the dry inert gas atmosphere, it is also possible to inhibit the evaporation of the liquid film of the process liquid.

(Second Embodiment)

A second embodiment according to the present invention will be described below.

The present embodiment differs from the first embodiment in that between the process liquid supply step S13 and the solidification step S15, a film thinning step S17 of thinning the liquid film of the process liquid and a temperature control step S18 are performed and that the atmosphere control step S14 is performed in parallel with the process liquid supply step S13, the film thinning step S17, the temperature control step S18 and the solidification step S15. The present embodiment also differs from the first embodiment in that in the solidification step S15, instead of supplying the nitrogen gas with the gas supply means 41, cold water serving as a coolant is supplied with the coolant supply means 91. In the configuration as described above, it is also possible to dry the front surface of the substrate W satisfactorily while inhibiting the collapse of the pattern.

<2-1 Configuration of Substrate Treating Apparatus and Process Liquid>

Since a substrate treating apparatus and a control unit according to the second embodiment basically have the same configurations as the substrate treating apparatus 1 and the control unit 13 according to the first embodiment (see FIGS. 1 to 7), they are identified with the same symbols, and the description thereof will be omitted. Since the process liquid (dry auxiliary liquid) used in the present embodiment is also the same as that according to the first embodiment, the description thereof will be omitted.

<2-2 Substrate Treating Method>

Next, a substrate treating method according to the second embodiment using the substrate treating apparatus 1 having the same configuration as in the first embodiment will be described.

Figure 11:
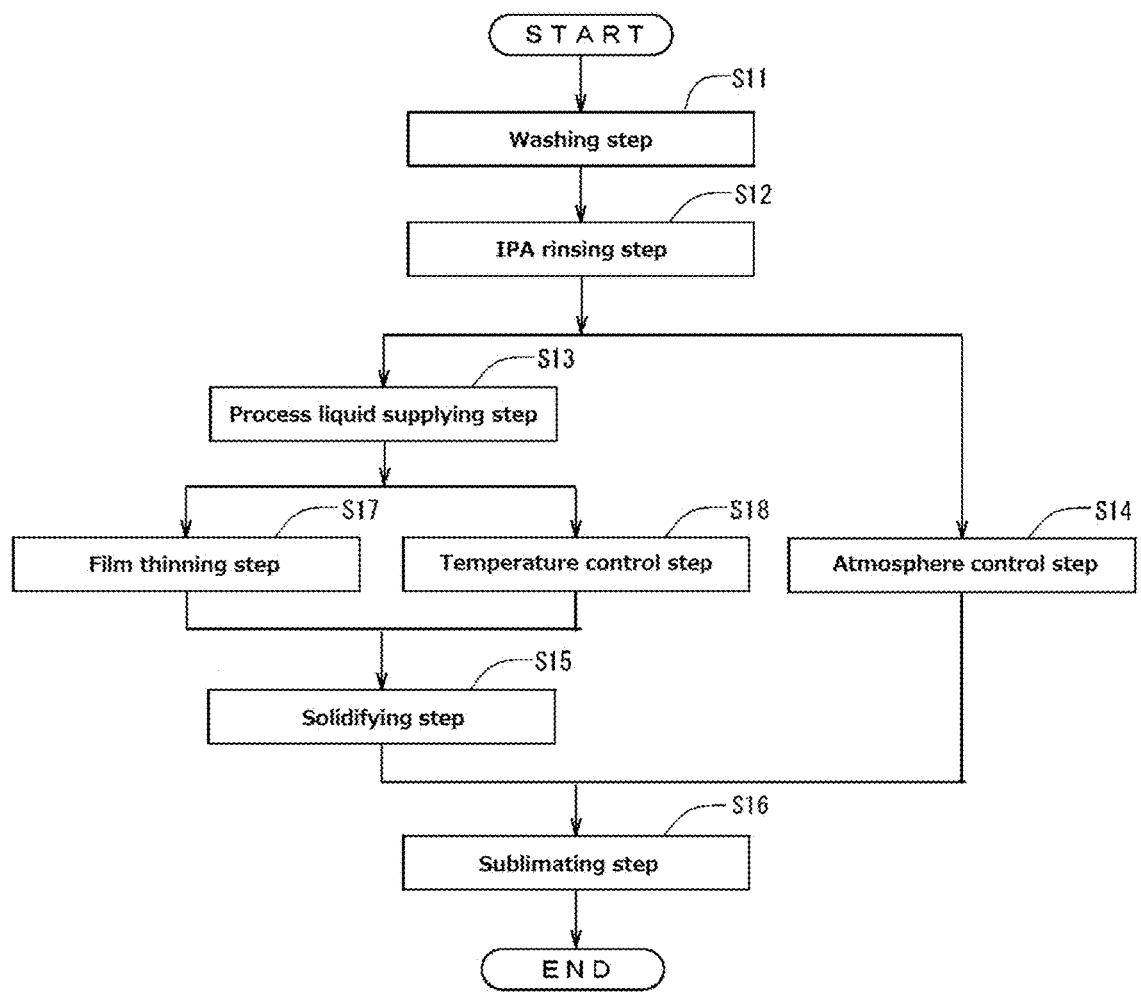
FIG. 11 is a flowchart showing a substrate treating method according to a second embodiment of the present invention.
Figure 12:
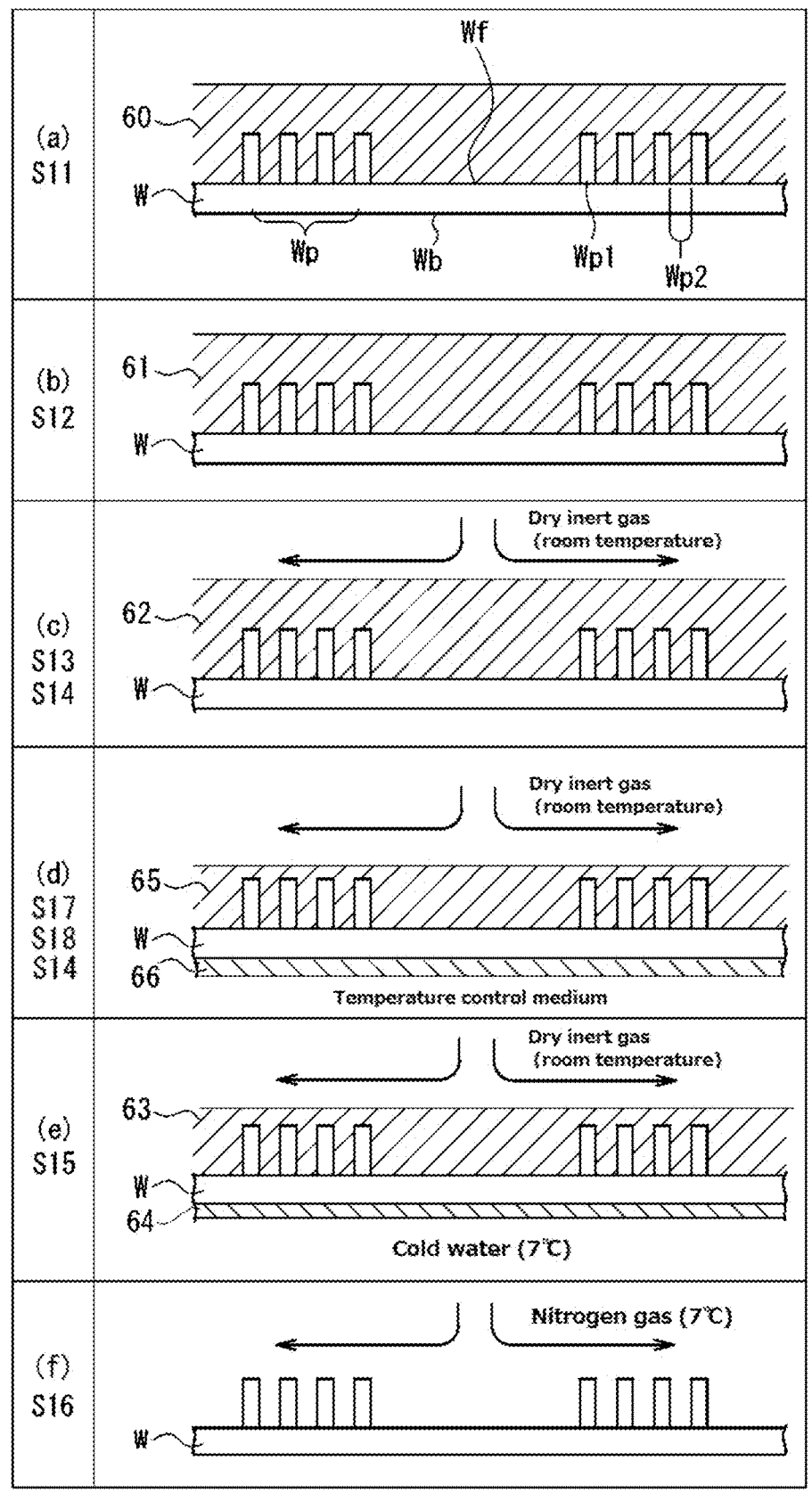
FIG. 12 is a diagram showing the state of a substrate in each step of the substrate treating method according to the second embodiment.
Figure 13:
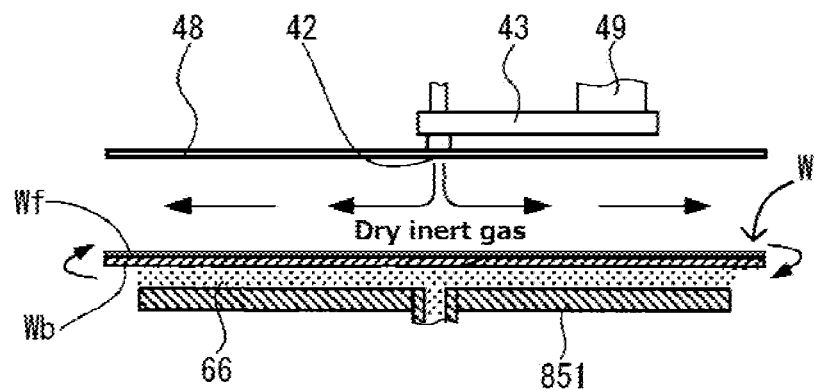
FIG. 13 is a schematic view for illustrating an operation of a substrate treating apparatus in a film thinning step and an atmosphere control step of the substrate treating method.

The steps of substrate processing will be described below with reference to FIGS. 1 to 7 and FIGS. 11 to 13 as necessary. FIG. 11 is a flowchart showing the operation of the substrate treating apparatus 1 according to the second embodiment. FIG. 12 is a schematic view showing the state of the substrate W in the individual steps of FIG. 11. FIG. 13 is a schematic view showing a state of the film thinning step of the liquid film of the process liquid and the atmosphere control step in the substrate treating method of the present embodiment. Since in the second embodiment, the individual steps of the washing step S11, the IPA rinse step S12 and the process liquid supply step S13 shown in FIG. 11, and (a) to (c), (e) and (f) shown in FIG. 12 are the same as in the first embodiment, the description thereof will be omitted. Unless otherwise specified, (a) to (f) shown in FIG. 12 are processed under the atmospheric pressure environment.

As shown in FIG. 11, after the process liquid supply step S13 is performed in parallel with the atmosphere control step S14, the film thinning step S17 of thinning the liquid film 62 of the process liquid formed on the front surface Wf of the substrate W and the temperature control step S18 are performed. The atmosphere control step S14 is also performed in parallel with the film thinning step S17 and the temperature control step S18.

In the film thinning step S17, first, as shown in FIG. 13, the control unit 13 provides operation instruction to the chuck rotation mechanism 56 such that the substrate W is rotated around the axis A1 at a constant speed. In this way, when the process liquid is supplied in excess to the front surface Wf of the substrate W, by spinning the process liquid off from the front surface Wf of the substrate W utilizing the action of centrifugal force produced by the rotation of the substrate W, it is possible to form the liquid film 62 having the optimum film thickness. Here, although the number of revolutions of the substrate W also depends on the film thickness of the liquid film 62, the number of revolutions of the substrate W is normally set within a range of 0 to 1000 rpm, preferably within a range of 10 to 8000 rpm, and more preferably within a range of 100 to 500 rpm. The thickness of the liquid film 62 is preferably set higher than the height of the convex portions Wp1 on the entire front surface Wf.

On the other hand, in the temperature control step S18, the control unit 13 also provides operation instruction to the valve 84 such that the valve 84 is opened. In this way, a fluidic temperature control medium 66 stored in the temperature control medium tank 821 is discharged through the pipe 83 and the supply pipe 852 from the discharge portion 853 to the back surface Wb of the substrate W. Furthermore, a space between the back surface Wb of the substrate W and the opposite member 851 is filled with the temperature control medium 66 discharged from the discharge portion 853 (see FIG. 13). The supply of the temperature control medium 66 can be performed either continuously or intermittently. With consideration given to the thickness of the substrate W and the like, the temperature of the temperature control medium 66 is preferably set such that the temperature of the thin film of the process liquid formed on the front surface Wf of the substrate W can be controlled within a temperature range which is equal to or higher than the melting point of the drying auxiliary substance but less than the boiling point thereof. In this way, the thin film of the process liquid can be prevented from becoming solidified due to heat of evaporation produced by the evaporation of the drying auxiliary substance. The amount of temperature control medium 66 supplied is not particularly limited as long as the temperature control medium 66 can make contact with the back surface Wb of the substrate W.

In this way, by controlling the temperature of the thin film of the process liquid formed on the front surface Wf of the substrate W with the temperature control medium 66 so as to be equal to or higher than the melting point of the drying auxiliary substance, the solidification of the process liquid caused by the heat of evaporation of the drying auxiliary substance can be prevented. Consequently, the formation of a solidified body which has internal stress and the like can be prevented, and the collapse of the pattern Wp caused by the internal stress of the solidified body can be prevented. The formation of a solidified body with a large film thickness can also be prevented, and thus it is possible to inhibit the collapse of the pattern Wp caused by this formation. Furthermore, it is possible to reduce residues such as particles that are produced on the front surface Wf of the substrate W after the removal step S16 which will be described later. The "internal stress" described above means stress which is produced in association with the growth mechanism of crystal and the process of film formation in a solidified body, and can include not only stress produced within the crystal (solidified body) but also tension produced on the surface of the crystal (solidified body).

In the atmosphere control step S14 which is performed in parallel with the film thinning step S17 and the temperature control step S18, the control unit 13 performs control such that the dry inert gas is discharged in a continuation from the process liquid supply step S13. Further, the height position of the nozzle 42 and the interruption plate 48 and the rotation of the interruption plate 48 at a constant speed are maintained. In this way, the thin film formed on the front surface Wf of the substrate W is prevented from being exposed to air and the like under the dry inert gas atmosphere.

Consequently, it is possible to prevent the thin film of the process liquid from becoming contaminated. The flow rate of the dry inert gas is the same as in the first embodiment. When in the process liquid supply step S13, at least the front surface Wf of the substrate W is filled with the dry inert gas atmosphere, during the film thinning step S17, only the height position of the interruption plate 48 may be maintained and the discharge of the dry inert gas and the rotation of the interruption plate 48 may be stopped. When the dry inert gas is discharged from the nozzle 42 toward the center of the substrate W, a collapse of the pattern may be caused by spraying of the dry inert gas. However, when the front surface Wf of the substrate W is filled with the dry inert gas atmosphere, by stopping the discharge of the dry inert gas, it is possible to minimize the collapse of the pattern caused by spraying of the dry inert gas. Here, the rotation of the interruption plate 48 is stopped in order to inhibit the flow of the dry inert gas from the center of the substrate W toward the peripheral portion.

The temperature control step S18 can be started by opening the valve 84 simultaneously with the start of the film thinning step S17. Here, the start of the film thinning step S17 means the time when the valve 26 is closed in the process liquid supply means 21. The temperature control step S18 may be started during the film thinning step S17. In this case, even if a part of the liquid film of the process liquid has started to solidify, the liquid film can be returned to the state of the melted thin film again, since it will be heated to the melting point of the drying auxiliary substance or higher.

There is no particular limitation as to when the temperature control step S18 is completed as long as the temperature control step S18 is completed before the start of the solidification step S15, but preferably, the temperature control step S18 is completed by closing the valve 84 simultaneously with the completion of the film thinning step S17. In this way, at least during the film thinning step S17, the process liquid can be prevented from becoming solidified. Here, the completion of the film thinning step S17 means that the control unit 13 provides operation instruction to the chuck rotation mechanism 56 such that the rotation of the substrate W is stopped.

(d) shown in FIG. 12 shows a state of the substrate W when the film thinning step S17, the temperature control step S18 and the atmosphere control step S14 are completed. As shown in the figure, on the front surface Wf of the substrate W on which the pattern wp is formed, a thin film 65 whose film thickness is smaller than the liquid film 62 is formed. The thin film 65 of the process liquid on the front surface Wf of the substrate W is under the dry inert gas atmosphere without evaporating, and is prevented from becoming contaminated. The temperature control medium 66 is in contact with the back surface Wb of the substrate W, preventing the thin film 65 of the process liquid on the front surface Wf from becoming solidified.

Then, as shown in FIG. 11, the solidification step S15 of solidifying the process liquid supplied to the front surface Wf of the substrate W so as to form the solidified film of the drying auxiliary substance is performed. The atmosphere control step S14 is also performed in parallel with the solidification step S15. The control unit 13 first provides operation instruction to the chuck rotation mechanism 56 such that the substrate W is rotated about the axis A1 at a constant speed. Here, the rotation speed of the substrate W is preferably set such that the film thickness of the thin film 65 formed of the process liquid is higher than the height of the convex portions Wp1 on the entire front surface Wf.

Then, the control unit 13 provides operation instruction to the valve 84 such that the valve 84 is opened. In this way, a coolant (for example, cold water of 7° C.) 64 stored in the coolant tank 921 is discharged through the pipe 83 and the supply pipe 852 from the discharge portion 853 toward the back surface Wb of the substrate W (see (e) shown in FIG. 12).

The coolant 64 supplied toward the back surface Wb of the substrate W is made to flow from around the center of the back surface Wb of the substrate W toward the direction of the peripheral portion of the substrate W by centrifugal force generated by the rotation of the substrate W so as to be diffused over the entire back surface Wb of the substrate W. In this way, the liquid film 65 of the process liquid formed on the front surface Wf of the substrate W is cooled to a low temperature which is equal to or lower than the freezing point of the drying auxiliary substance so as to be solidified, with the result that the solidified body 63 is formed (see (e) shown in FIG. 12).

Further, in the atmosphere control step S14 which is performed in parallel with the solidification step S15, the control unit 13 performs control such that the dry inert gas is discharged in a continuation from the process liquid supply step S13. Also, the positions of height of the nozzle 42 and the interruption plate 48 and the rotation of the interruption plate 48 at a constant speed are maintained. In this way, during the solidification step S15, it is possible to prevent the dew condensation of the process liquid on the front surface Wf caused by the cooling of the substrate W. In a case where at least the front surface Wf of the substrate W is filled with the dry inert gas atmosphere during the process liquid supply step S13 and the film thinning step S17, only the height position of the interruption plate 48 may be maintained and the discharge of the dry inert gas and the rotation of the interruption plate 48 may be stopped during the solidification step S15. In this case, it is also possible to prevent the collapse of the pattern caused by spraying of the dry inert gas.

When the atmosphere control step S14 is completed, the control unit 13 provides operation instruction to the valve 46b such that the valve 46b is closed. Furthermore, the control unit 13 provides operation instruction to the raising/lowering drive part 16 such that the raising/lowering mechanism 49 is used to raise the nozzle 42 and the interruption plate 48, separating the nozzle 42 and the interruption plate 48 from the front surface Wf of the substrate W.

The atmosphere control step S14 can be completed by closing the valve 46b simultaneously with the completion of the solidification step S15. The atmosphere control step S14 may be completed during the solidification step S15, for example, after a freely-selected time has elapsed since the start of the supply of the coolant 64. Alternatively, the atmosphere control step S14 may be completed after the completion of the solidification step S15 and before the start of the removal step S16.

(e) shown in FIG. 12 shows a state of the substrate W when the solidification step S15 is completed. As shown in the figure, the thin film 65 formed of the process liquid is cooled by the supply of the coolant 64 to the back surface Wb of the substrate W so as to be solidified, with the result that the solidified body 63 containing the drying auxiliary substance is formed.

Then, the removal step S16 of subliming the solidified body 63 formed on the front surface Wf of the substrate W so as to remove the solidified body 63 from the front surface Wf of the substrate W is performed. In the removal step S16, the gas (nitrogen gas) is also supplied from the nozzle 42 in a continuation from the solidification step S15.

Here, the partial pressure of the vapor of the drying auxiliary substance in the nitrogen gas is set lower than the saturated vapor pressure of the drying auxiliary substance at a temperature when the nitrogen gas is supplied. Hence, when such nitrogen gas is supplied to the front surface Wf of the substrate W so as to make contact with the solidified body 63, the drying auxiliary substance is sublimed from the solidified body 63 into the nitrogen gas. Further, since the nitrogen gas has a temperature lower than the melting point of the drying auxiliary substance, the solidified body 63 can be sublimed while preventing the solidified body 63 from becoming melted.

In this way, by the sublimation of the drying auxiliary substance in a solid state, when the substance such as the IPA present on the front surface Wf of the substrate W is removed, surface tension is prevented from acting on the pattern Wp and the front surface Wf of the substrate W can be dried satisfactorily while inhibiting the collapse of the pattern.

(f) shown in FIG. 12 shows a state of the substrate W when the removal step S16 is completed. As shown in the figure, the solidified body 63 of the drying auxiliary substance formed in the solidification step S15 is sublimed by the supply of the nitrogen gas of 7° C. so as to be removed from the front surface Wf, with the result that the drying of the front surface Wf of the substrate W is completed.

After the completion of the removal step S16, the control unit 13 provides operation instruction to the valve 46a such that the valve 46a is closed.

In this way, the series of substrate drying processing steps are completed. After the substrate drying processing as described above, the substrate W on which the drying processing has been performed is unloaded from the chamber 11 by the unillustrated substrate loading/unloading mechanism.

As described above, in the present embodiment, since the atmosphere control step S14 is performed both in the process liquid supply step S13 and the film thinning step S17, as in the first embodiment, the liquid film of the process liquid formed in the process liquid supply step S13 can be prevented from becoming contaminated, and the contamination can also be prevented during the thinning of the liquid film of the process liquid in the film thinning step S17. Furthermore, in the solidification step S15 and the removal step S16, the common gas supply means 41 is used to supply the nitrogen gas which is inert to the drying auxiliary substance at a temperature equal to or lower than the freezing point of the drying auxiliary substance, with the result that the removal step S16 can be started immediately after the solidification step S15. Consequently, it is possible to reduce processing time for operating the individual portions of the substrate treating apparatus 1 and the amount of memory in the substrate processing program 19 of the control unit 13 which is operated. Furthermore, the number of components which are used in the processing can be reduced, and the cost of the device can be reduced. In particular, since the pressure reduction means 71 is not used in the present embodiment, it is possible to omit the pressure reduction means 71.

(Variations)

In the first embodiment and the second embodiment, within the one chamber 11, the individual steps are performed on the substrate W. However, there is no limitation to this configuration in the practice of the present invention, and a chamber may be prepared for each of the steps.

For example, in each of the embodiments, the following configuration may be adopted in which the steps up to the solidifying step S15 are performed in a first chamber, in which after the solidified film is formed on the front surface Wf of the substrate W, the substrate W is unloaded from the first chamber, in which the substrate W where the solidified film is formed is loaded into a separate second chamber and in which the sublimating step S16 is performed in the second chamber.

Further, in the first and second embodiments, the pressure reduction means 71 may be used instead of the gas supply means 41 and the coolant supply means 91 in the solidification step S15 and the removal step S16. Specifically, in the solidification step S15, the control unit 13 provides operation instruction to the exhaust pump 72 such that the drive of the exhaust pump 72 is started. Then, the control unit 13 provides operation instruction to the valve 74 such that the valve 74 is opened. In this way, the gas within the chamber 11 is exhausted through the pipe 73 to the outside of the chamber 11. By bringing the interior of the chamber 11 into a sealed state except the pipe 73, the internal environment of the chamber 11 is reduced in pressure from atmospheric pressure.

The pressure reduction is performed from atmospheric pressure (about 1 atmosphere, about 1013 hPa) to about $1.7 \times 10^{-5}$ atmospheres (1.7 Pa). The practice of the invention of the present application is not limited to the atmosphere described above in, and the atmosphere within the chamber 11 after the pressure reduction may be set as necessary according to the pressure resistance and the like of the chamber 11 and the like. When the interior of the chamber 11 is reduced in pressure, the drying auxiliary substance is evaporated from the liquid film 62 of the process liquid supplied to the front surface Wf of the substrate W or the thin film 65 obtained by thinning the liquid film 62. Here, since heat of evaporation is removed from the liquid film 62 of the process liquid and the like, the liquid film 62 and the like are cooled so as to be solidified.

In the removal step S16, by pressure reduction processing, an environment within the chamber 11 has a pressure which is lower than the saturated vapor pressure of the drying auxiliary substance. Consequently, by maintaining the reduced-pressure environment as described above, the drying auxiliary substance is sublimed from the solidified body 63.

In the first and second embodiments, as the removal step S16, the example of sublimation where the solidified body 63 is changed in its state from a solid phase to a gas phase is described. However, the removal step S16 of the present invention is not limited to the case where the solidified body 63 is sublimed, and can include, for example, a case where the solidified body 63 is removed such as by thermal decomposition or plasma decomposition.

Furthermore, in the first and second embodiments, the temperature control step S18 may be performed in parallel with the process liquid supply step S13. In this way, it is possible to prevent the solidification of the process liquid from the stage of supply of the process liquid to the front surface Wf of the substrate W. In this case, the temperature control step S14 can be started by opening the valve 84 simultaneously with the start of the process liquid supply step S13. Here, the start of the process liquid supply step S13 means the time when the valve 26 is opened in the process liquid supply means 21. The temperature control step S14 may be started during the process liquid supply step S13, for example, after a freely-selected time has elapsed since the start of the supply of the process liquid. In this case, even if a part of the liquid film of the process liquid has started to solidify during the supply thereof, the liquid film can be returned to the state of the melted liquid film again, since it is heated to the melting point of the drying auxiliary substance or higher.

In the second embodiment, in the solidification step S15, by using the coolant supply means 91 to supply the coolant 64 to the back surface Wb of the substrate W, the thin film 65 is solidified. However, the present invention is not limited to this embodiment. For example, while the coolant 64 is supplied with the coolant supply means 91 to the back surface Wb of the substrate W, the nitrogen gas can be supplied with the gas supply means 41 to the thin film 65 of the process liquid so as to perform the solidification step.

Furthermore, in the second embodiment, the atmosphere control step S14 is performed in parallel with the process liquid supply step S13, the film thinning step S17 and the solidification step S15. However, the present invention is not limited to this embodiment. For example, the atmosphere control step S14 may be completed together with the film thinning step S17. In this case, the atmosphere control step S14 can be completed by closing the valve 46b simultaneously with the completion of the film thinning step S17. Further, the atmosphere control step S14 may be completed during the film thinning step S17, for example, after a freely-selected time has elapsed since the start of the thinning of the liquid film 62. Alternatively, the atmosphere control step S14 may be completed after the completion of the film thinning step S17 and before the start of the solidification step S15.

Preferred examples of this invention will be illustratively described in detail below. However, unless otherwise restrictively described, materials, mixed amounts and the like described in the examples are not intended to limit the scope of this invention.

(Substrate with Pattern)

Figure 14:
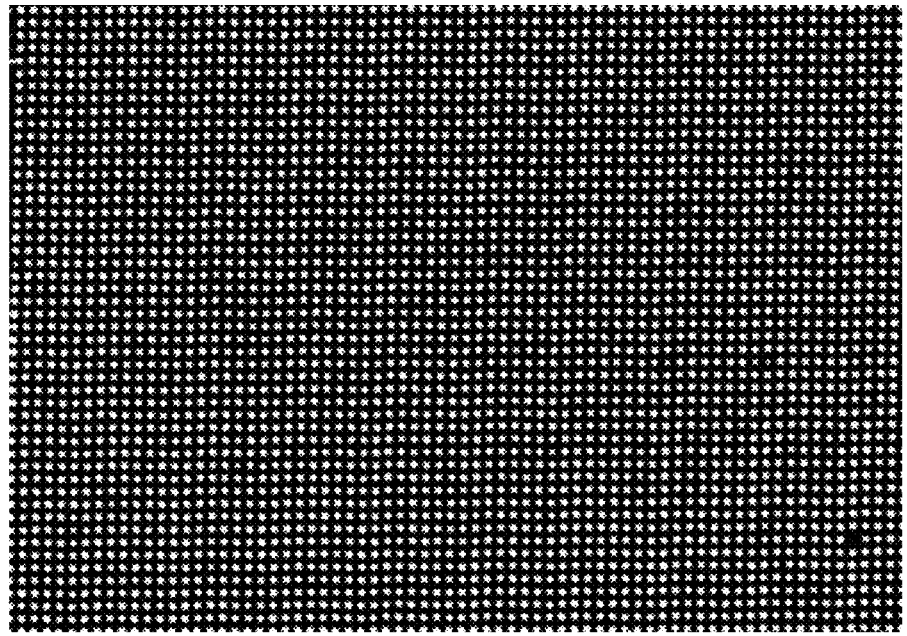
FIG. 14 is an SEM image showing the pattern formation surface of a coupon in an unprocessed silicon substrate used in examples of the present invention.

As a substrate with a pattern, a silicon substrate on which a model pattern was formed on the front surface was prepared, and a 1 cm square coupon (specimen) was cut out from the silicon substrate. A pattern in which cylinders (aspect ratio of about 20) having a diameter of about 30 nm and a height of about 600 nm were arranged was adopted as the model pattern. FIG. 14 is an SEM (Scanning Electron Microscope) image showing a surface on which the pattern of the coupon was formed (magnification: 20,000 times). The parts indicated by the color white in FIG. 14 are the head portions of the cylinder portions (that is, the convex portions of the pattern), and the parts indicated by the color black are concave portions of the pattern. As shown in FIG. 14, it is confirmed that white circles having substantially equal sizes are arranged regularly on the pattern formation surface.

Example 1

In the present example, used was the coupon which was cut out from the silicon substrate described above, and the drying processing thereof was performed by procedures described below to evaluate the effects of inhibiting the collapse of the pattern.

<Application of Ultraviolet Rays>

First, ultraviolet rays were applied to the pattern formation surface of the coupon so as to make the front surface property thereof hydrophilic. In this way, it was made easier for liquid to enter the concave portions of the pattern, artificially forming an environment where, after the supply of the liquid, the collapse of a pattern would readily occur.

<Supply Step>

Then, after the coupon was put into a vial bottle, 5 ml of a process liquid (liquid temperature of 40° C.) obtained by melting a drying auxiliary substance at room temperature (23° C.) under atmospheric pressure (1 atmosphere) was introduced therein so as to from a liquid film made of the process liquid on the pattern formation surface of the coupon. As the drying auxiliary substance, 1, 1, 2, 2, 3, 3, 4-heptafluorocyclopentane represented by the chemical structure below was used. The compound is a substance in which the melting point and the freezing point are 20.5° C., the vapor pressure is 8200 Pa (25° C.), the melting entropy is 0.087 J/cm$^3$·K (1 atm, melting point) and the sublimation entropy is 1.005 J/cm$^3$·K (1 atm, 0° C.). Furthermore, the compound is excellent in the solubility of fluoropolymer so as to be used as a solvent for various types of coating agents or a detergent for oil film stains.

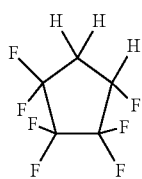

Chemical formula 1

<Solidification Step>

Then, the vial bottle was placed within a freezing chamber such that the liquid film was solidified under atmospheric pressure (1 atmosphere) in an atmosphere of −10° C., thereby forming a solidified body on the pattern formation surface of the coupon.

<Removal Step>

Furthermore, the temperature within the freezing chamber was changed to 0° C. and the vial bottle was continuously placed therein, and in this way, the solidified body was sublimed while the melting thereof was prevented, with the result that the solidified body was removed from the pattern formation surface of the coupon.

Figure 15:
FIG. 15 is an SEM image showing the pattern formation surface of a coupon in a silicon substrate on which substrate processing according to example 1 of the present invention was performed.

After the confirmation of removal of the solidified body, the coupon was taken out of the vial bottle, the collapse rate of the pattern was calculated, and the effect of inhibiting the collapse of the pattern on the pattern formation surface was evaluated by the collapse rate. FIG. 15 shows an SEM image of the pattern formation surface of the coupon after the drying processing according to the present example was performed (magnification: 10,000 times). As compared with the pattern formation surface of the coupon before the drying processing (see FIG. 14), the collapse of the pattern was reduced, and the collapse rate in the displayed region was 0.9%. In this way, it is indicated that when 1, 1, 2, 2, 3, 3, 4-heptafluorocyclopentane is used as the drying auxiliary substance, the collapse of the pattern can be extremely satisfactorily inhibited and that it is effective for sublimation drying.

The collapse rate of the pattern was a value which was calculated by the formula below.

collapse rate (%)=(the number of convex portions collapsed in a freely-selected region)/(the total number of convex portions in the region)×100

Example 2

In the present example, instead of 1, 1, 2, 2, 3, 3, 4-heptafluorocyclopentane, dodecafluorocyclohexane (melting point of 51° C., vapor pressure of 33103.7 Pa (25° C.), melting entropy of 0.144 J/cm$^3$·K (1 atm, melting point), sublimation entropy of 0.748 J/cm$^3$·K (1 atm, 0° C.)) was used as the drying auxiliary substance. Except for this, drying processing was performed on the pattern formation surface of the coupon as was in example 1.

Figure 16:
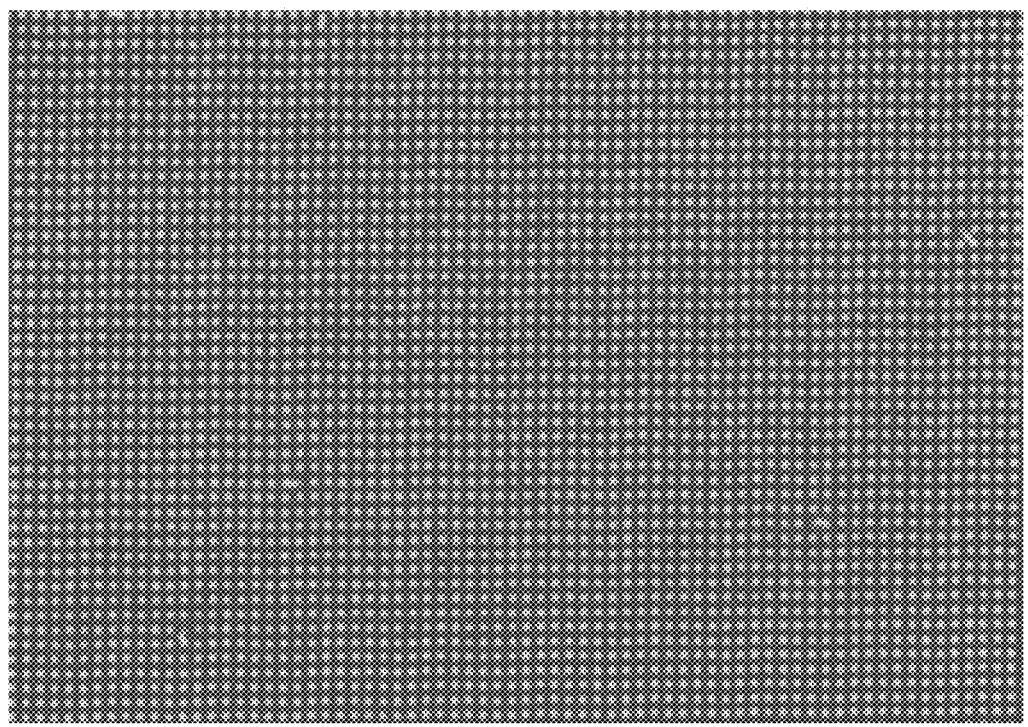
FIG. 16 is an SEM image showing the pattern formation surface of a coupon in a silicon substrate on which substrate processing according to example 2 of the present invention was performed.

FIG. 16 is an SEM image of the pattern formation surface of the coupon after the drying processing according to the present example was performed (magnification: 20,000 times). As compared with the pattern formation surface of the coupon before the drying processing (see FIG. 14), the collapse of the pattern was significantly reduced, and the collapse rate in the displayed region was 2.5%. In this way, it is indicated that when dodecafluorocyclohexane is used as the drying auxiliary substance, the collapse of the pattern can be extremely satisfactorily inhibited and that it is effective for sublimation drying.

Example 3

In the present example, instead of 1, 1, 2, 2, 3, 3, 4-heptafluorocyclopentane, fluorocyclohexane (melting point of 13° C., vapor pressure of 5679.1 Pa (25° C.), melting entropy of 0.082 J/cm$^3$·K (1 atm, melting point), sublimation entropy of 1.25 J/cm$^3$·K (1 atm, 0° C.)) was used as the drying auxiliary substance. Except for this, drying processing was performed on the pattern formation surface of the coupon as was in example 1.

Figure 17:
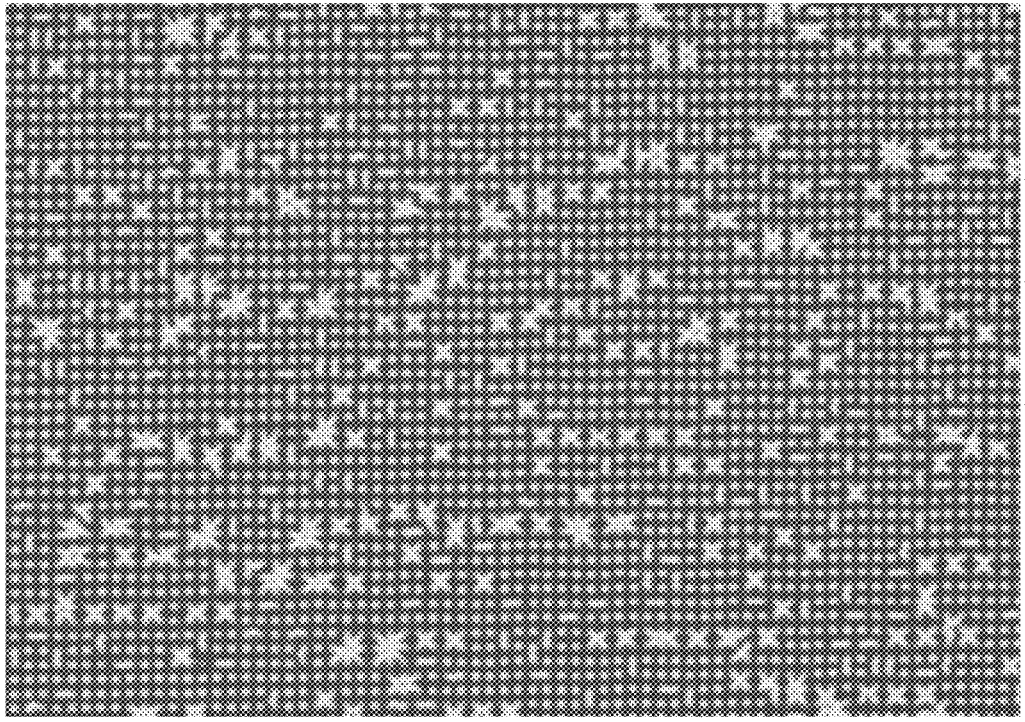
FIG. 17 is an SEM image showing the pattern formation surface of a coupon in a silicon substrate on which substrate processing according to example 3 of the present invention was performed.

FIG. 17 is an SEM image of the pattern formation surface of the coupon after the drying processing according to the present example was performed (magnification: 20,000 times). As compared with the pattern formation surface of the coupon before the drying processing (see FIG. 14), the collapse of the pattern was significantly reduced, and the collapse rate in the displayed region was 35.8%. In this way, it is indicated that when fluorocyclohexane is used as the drying auxiliary substance, the collapse of the pattern can be inhibited and that it is effective for sublimation drying.

Example 4

In the present example, instead of 1, 1, 2, 2, 3, 3, 4-heptafluorocyclopentane, p-xylene (melting point of 13.4°

C., vapor pressure of 1114 Pa (25° C.), melting entropy of 0.479 J/cm$^3$·K (1 atm, melting point), sublimation entropy of 2.007 J/cm$^3$·K (1 atm, 0° C.)) was used as the drying auxiliary substance. Except for this, drying processing was performed on the pattern formation surface of the coupon as was in example 1.

Figure 18:
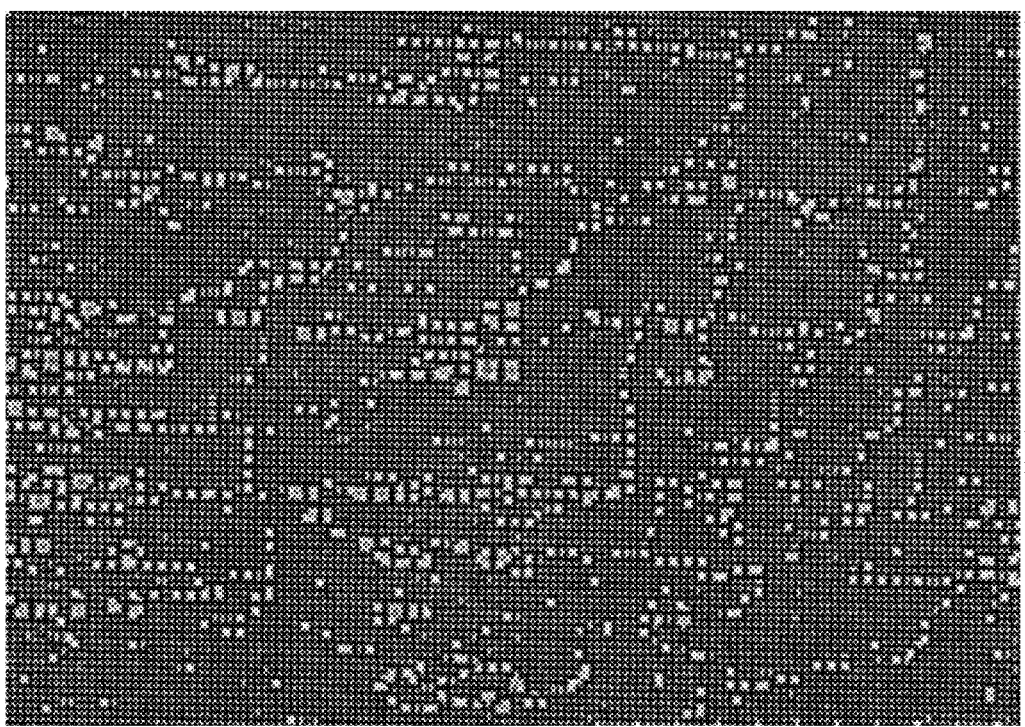
FIG. 18 is an SEM image showing the pattern formation surface of a coupon in a silicon substrate on which substrate processing according to example 4 of the present invention was performed.

FIG. 18 is an SEM image of the pattern formation surface of the coupon after the drying processing according to the present example was performed (magnification: 10,000 times). As compared with the pattern formation surface of the coupon before the drying processing (see FIG. 14), the collapse of the pattern was significantly reduced, and the collapse rate in the displayed region was 27.9%. In this way, it is indicated that when p-xylene is used as the drying auxiliary substance, the collapse of the pattern can also be satisfactorily inhibited and that it is effective for sublimation drying.

Example 5

In the present example, instead of 1, 1, 2, 2, 3, 3, 4-heptafluorocyclopentane, hexafluorobenzene (melting point of 5.7 to 5.8° C., vapor pressure of 11238 Pa (25° C.), melting entropy of 0.36 J/cm$^3$·K (1 atm, melting point), sublimation entropy of 1.761 J/cm$^3$·K (1 atm, 0° C.)) was used as the drying auxiliary substance. Except for this, drying processing was performed on the pattern formation surface of the coupon as was in example 1.

Figure 19:
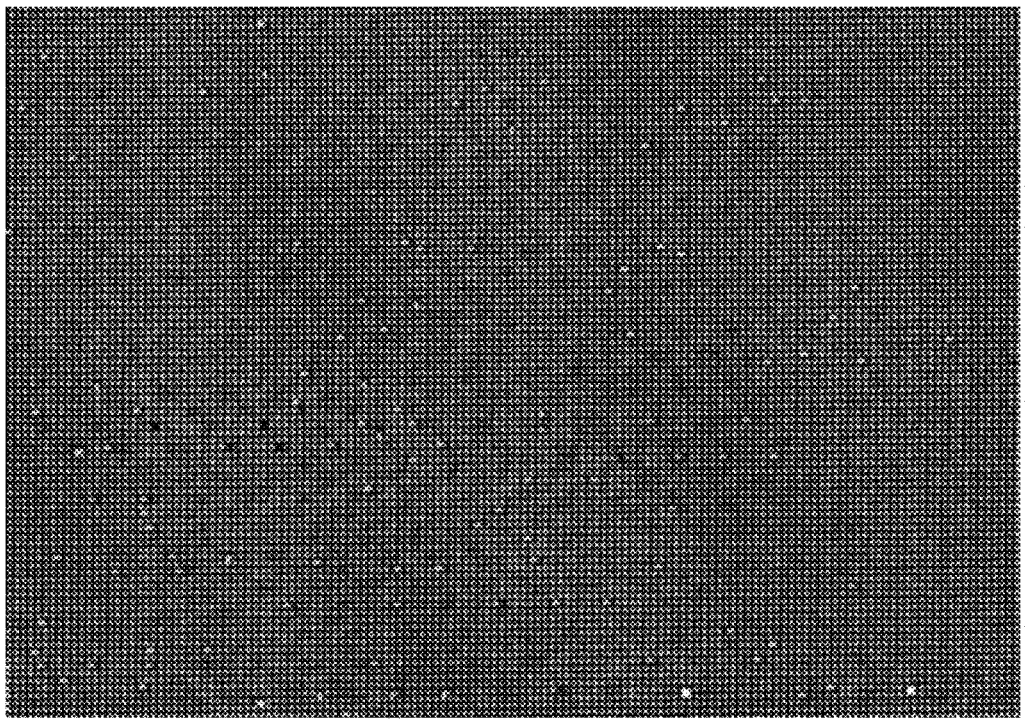
FIG. 19 is an SEM image showing the pattern formation surface of a coupon in a silicon substrate on which substrate processing according to example 5 of the present invention was performed.

FIG. 19 is an SEM image of the pattern formation surface of the coupon after the drying processing according to the present example was performed (magnification: 10,000 times). As compared with the pattern formation surface of the coupon before the drying processing (see FIG. 14), the collapse of the pattern was significantly reduced, and the collapse rate in the displayed region was 1.7%. In this way, it is indicated that when hexafluorobenzene is used as the drying auxiliary substance, the collapse of the pattern can also be extremely satisfactorily inhibited and that it is effective for sublimation drying.

Example 6

In the present example, instead of 1, 1, 2, 2, 3, 3, 4-heptafluorocyclopentane, cyclohexane (melting point of 6.68° C., vapor pressure of 13018 Pa (25° C.), melting entropy of 0.089 J/cm$^3$·K (1 atm, melting point), sublimation entropy of 1.209 J/cm$^3$·K (1 atm, 0° C.)) was used as the drying auxiliary substance. Except for this, drying processing was performed on the pattern formation surface of the coupon as was in example 1.

Figure 20:
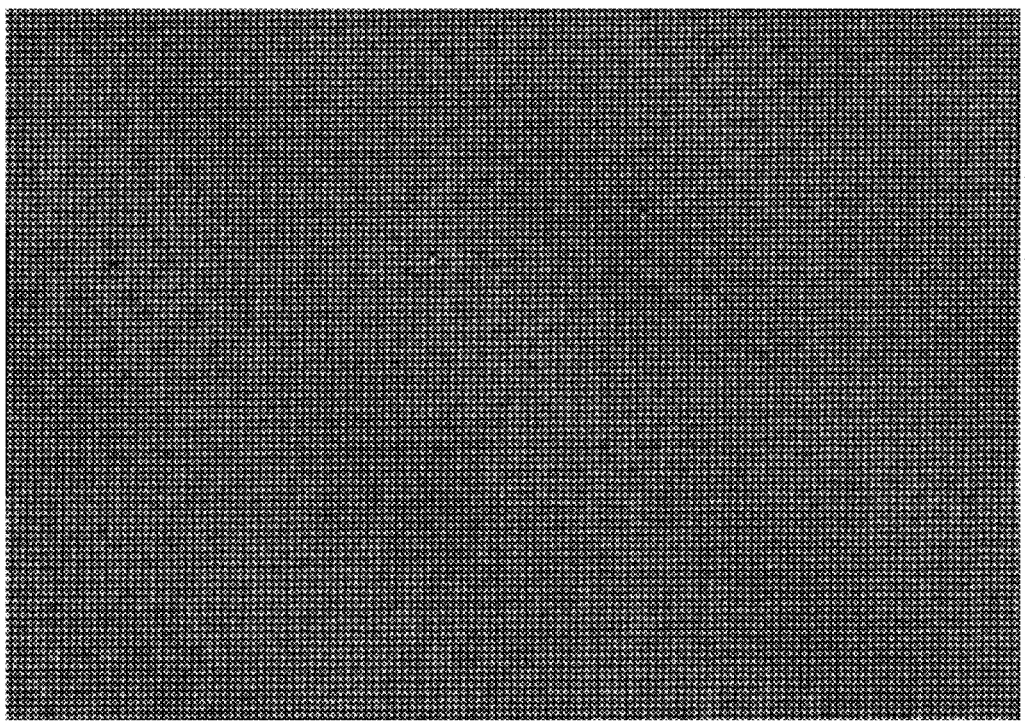
FIG. 20 is an SEM image showing the pattern formation surface of a coupon in a silicon substrate on which substrate processing according to example 6 of the present invention was performed.

FIG. 20 is an SEM image of the pattern formation surface of the coupon after the drying processing according to the present example was performed (magnification: 10,000 times). As compared with the pattern formation surface of the coupon before the drying processing (see FIG. 14), the collapse of the pattern was significantly reduced, and the collapse rate in the displayed region dropped below 0.1%. In this way, it is indicated that when cyclohexane is used as the drying auxiliary substance, the collapse of the pattern can also be extremely satisfactorily inhibited and that it is effective for sublimation drying.

Comparative Example 1

In the present comparative example, instead of 1, 1, 2, 2, 3, 3, 4-heptafluorocyclopentane, acetic acid (melting point of 16.5° C., vapor pressure of 2074.8 Pa (25° C.), melting entropy of 0.655 J/cm$^3$·K (1 atm, melting point), sublimation entropy of 2.756 J/cm$^3$·K (1 atm, 0° C.)) was used as the drying auxiliary substance. Except for this, drying processing was performed on the pattern formation surface of the coupon as was in example 1.

Figure 21:
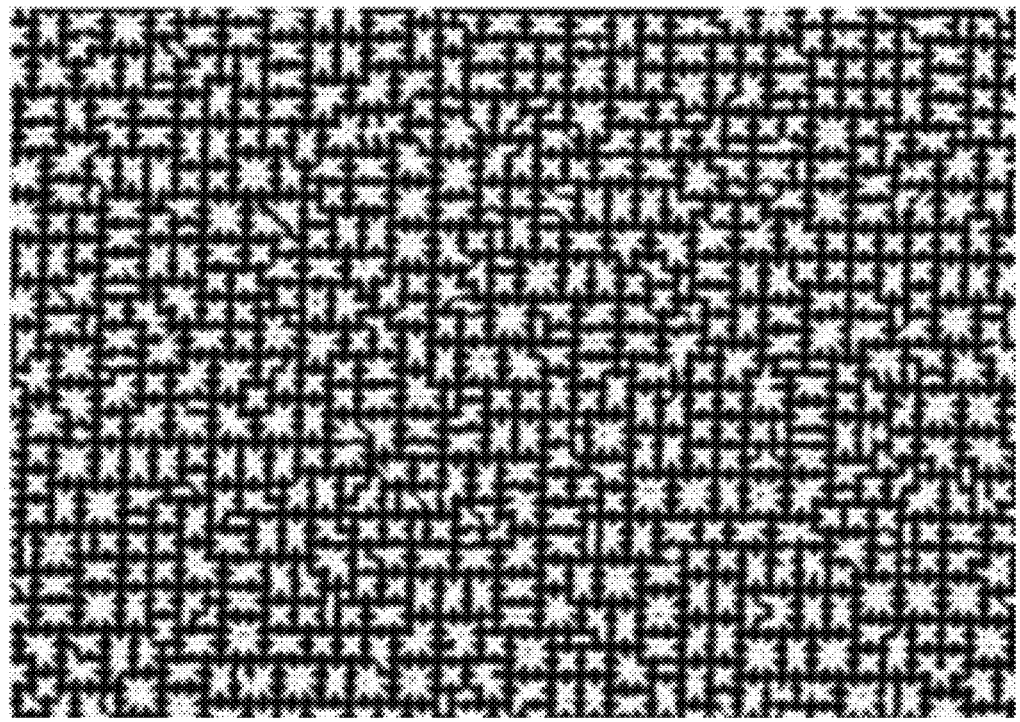
FIG. 21 is an SEM image showing the pattern formation surface of a coupon in a silicon substrate on which substrate processing according to comparative example 1 was performed.

FIG. 21 is an SEM image of the pattern formation surface of the coupon after the drying processing according to the present comparative example was performed (magnification: 20,000 times). As compared with the pattern formation surface of the coupon before the drying processing (see FIG. 14), the collapse of the pattern occurred drastically, and the collapse rate in the displayed region was 99.1%. In this way, it is confirmed that when acetic acid is used as the drying auxiliary substance, the collapse of the pattern is not sufficiently reduced.

Comparative Example 2

In the present comparative example, instead of 1, 1, 2, 2, 3, 3, 4-heptafluorocyclopentane, 1, 4-dioxane (melting point of 11.8° C., vapor pressure of 4814.6 Pa (25° C.), melting entropy of 0.513 J/cm$^3$·K (1 atm, melting point), sublimation entropy of 2.645 J/cm$^3$·K (1 atm, 0° C.)) was used as the drying auxiliary substance. Except for this, drying processing was performed on the pattern formation surface of the coupon as was in example 1.

Figure 22:
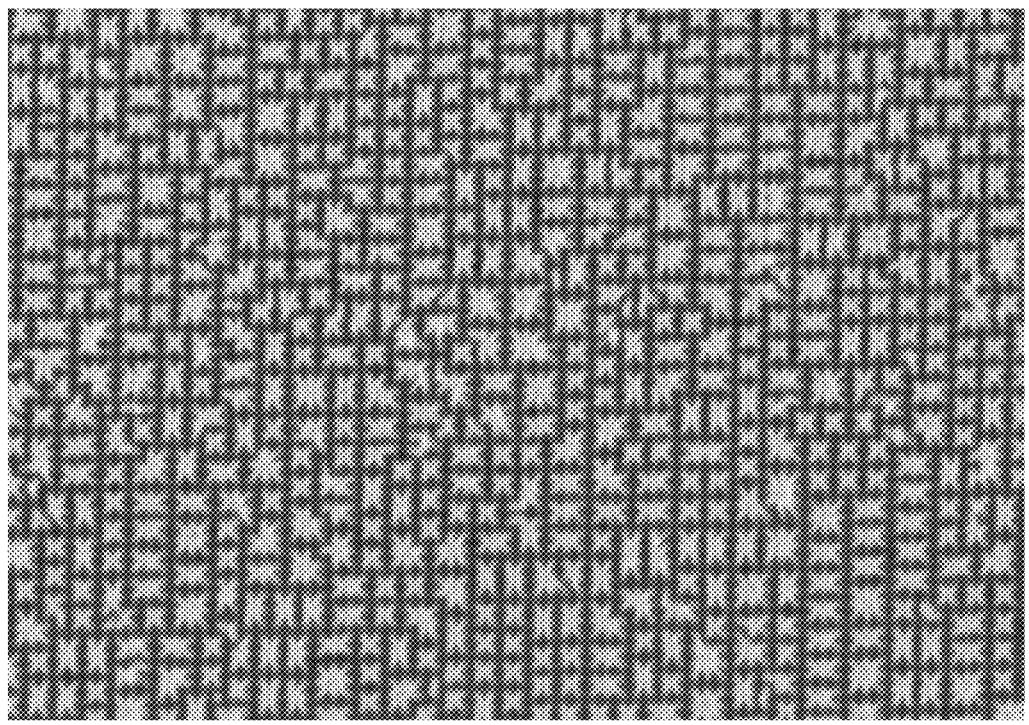
FIG. 22 is an SEM image showing the pattern formation surface of a coupon in a silicon substrate on which substrate processing according to comparative example 2 was performed.

FIG. 22 is an SEM image of the pattern formation surface of the coupon after the drying processing according to the present comparative example was performed (magnification: 20,000 times). As compared with the pattern formation surface of the coupon before the drying processing (see FIG. 14), the collapse of the pattern occurred drastically, and the collapse rate in the displayed region was 99.3%. In this way, it is confirmed that when 1, 4-dioxane is used as the drying auxiliary substance, the collapse of the pattern is not sufficiently reduced.

(Substrate)

Figure 23:
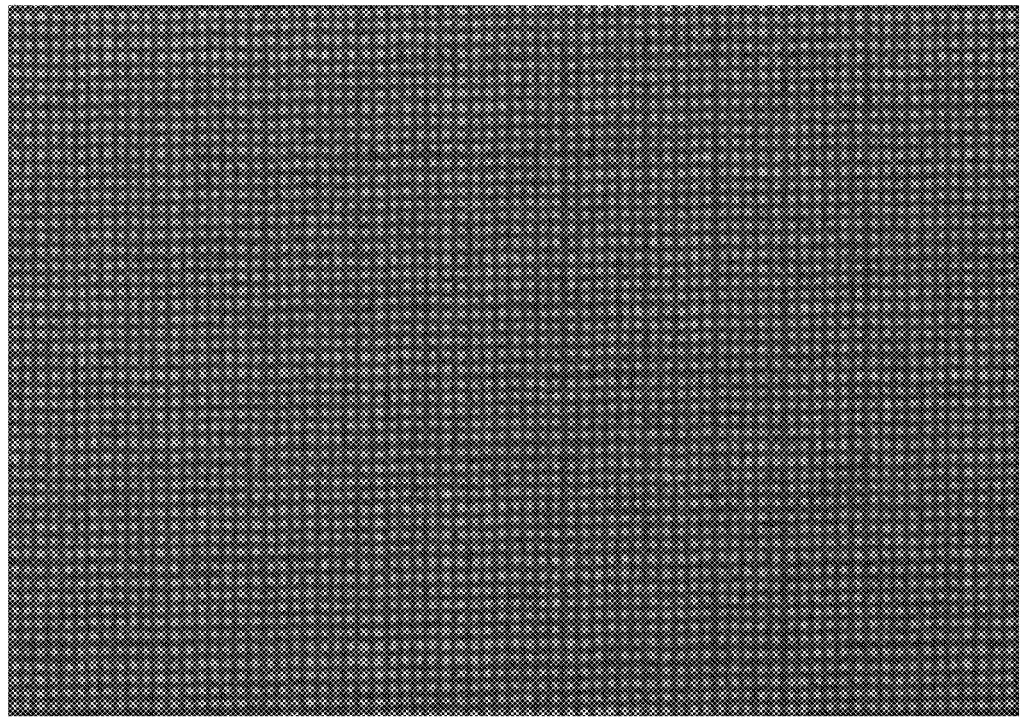
FIG. 23 is an SEM image showing the pattern formation surface of the unprocessed silicon substrate used in examples of the present invention.

A silicon substrate on which a model pattern was formed on the front surface was prepared as the substrate. FIG. 23 is an SEM image showing a surface on which the model pattern of the silicon substrate was formed (magnification: 20,000 times). A pattern in which cylinders (aspect ratio of about 20) having a diameter of about 30 nm and a height of about 600 nm were arranged was adopted as the model pattern. The parts indicated by the color white in FIG. 23 are the head portions of the cylinder portions (that is, the convex portions of the pattern), and the parts indicated by black are the concave portions. As shown in FIG. 23, it is confirmed that white circles having substantially equal sizes are arranged regularly on the pattern formation surface.

Example 7

In the present example, the drying processing of the silicon substrate was performed by procedures described below, and the effect of inhibiting the collapse of the pattern was evaluated. In the processing of the silicon substrate, the substrate treating apparatus described in the first embodiment was used.

<Application of Ultraviolet Rays>

First, ultraviolet rays were applied to the surface of the silicon substrate so as to make the front surface property thereof hydrophilic. In this way, it was made easier for liquid to enter the concave portions of the pattern, artificially forming an environment where, after the supply of the liquid, the collapse of a pattern would readily occur.

<Supply Step>

Then, within the chamber 11 under atmospheric pressure, the process liquid (dry auxiliary liquid (liquid temperature 25° C.)) obtained by melting the drying auxiliary substance was directly supplied to the pattern formation surface of the silicon substrate which was dried. In this way, on the pattern formation surface of the silicon substrate, a liquid film (film thickness of about 50 μm) made of the process liquid was formed. As the drying auxiliary substance, 1, 2, 2, 3, 3, 4-heptafluorocyclopentane was used as was in example 1.

<Film Thinning Step, Temperature Control Step and Atmosphere Control Step>

Then, a film thinning step was performed such that the liquid film of the process liquid formed on the pattern formation surface was a thin film whose thickness was slightly less than 10 μm. The number of revolutions of the silicon substrate was set to 200 rpm.

When the liquid film of the process liquid was thinned, dry nitrogen gas (dry inert gas) having a temperature of 25° C. was sprayed to the pattern formation surface of the silicon substrate so as to perform the atmosphere control step. Here, the flow rate of the nitrogen gas was set to 30 l/min. Furthermore, the number of revolutions of the interruption plate and the silicon substrate was set to 200 rpm while they were rotated synchronously with each other. The clearance between the silicon substrate and the interruption plate was set to 10 mm. In this way, the dry nitrogen gas was made to flow from the center of the pattern formation surface of the silicon substrate toward the peripheral portion in in a laminar flow state, and thus the pattern formation surface was placed under the flow of the dry nitrogen gas, with the result that the evaporation of the thin film of the process liquid was inhibited.

Furthermore, when the liquid film of the process liquid was thinned, DIW (deionized water) having a temperature of 25° C. was also supplied to the back surface of the silicon substrate so as to perform the temperature control step. The amount of DIW supplied was set within a range of 2.5 to 2.8 l/min. In this way, the thin film of the process liquid was prevented from becoming solidified on the pattern formation surface. The supply of the DIW was completed simultaneously with the completion of the film thinning step of the process liquid.

<Solidification Step>

Then, under the atmospheric pressure environment, cold water of 2 to 3° C. was supplied to the back surface of the silicon substrate on which the liquid film made of the process liquid was formed, and the thin film of the process liquid was solidified via the silicon substrate so as to form a solidified body. The amount of cold water supplied was set within a range 1.4 to 1.6 l/min. The film thickness of the solidified body formed was slightly less than 10 μm.

<Removal Step>

Furthermore, while cold water of 7° C. had been supplied in a continuation from the solidification step, nitrogen gas of 7° C. was supplied to the solidified body at room temperature under the atmospheric pressure environment. In this way, while the melting of the solidified body was prevented, the drying auxiliary substance was sublimed, and thus the solidified body was removed from the pattern formation surface of the silicon substrate.

Figure 24:
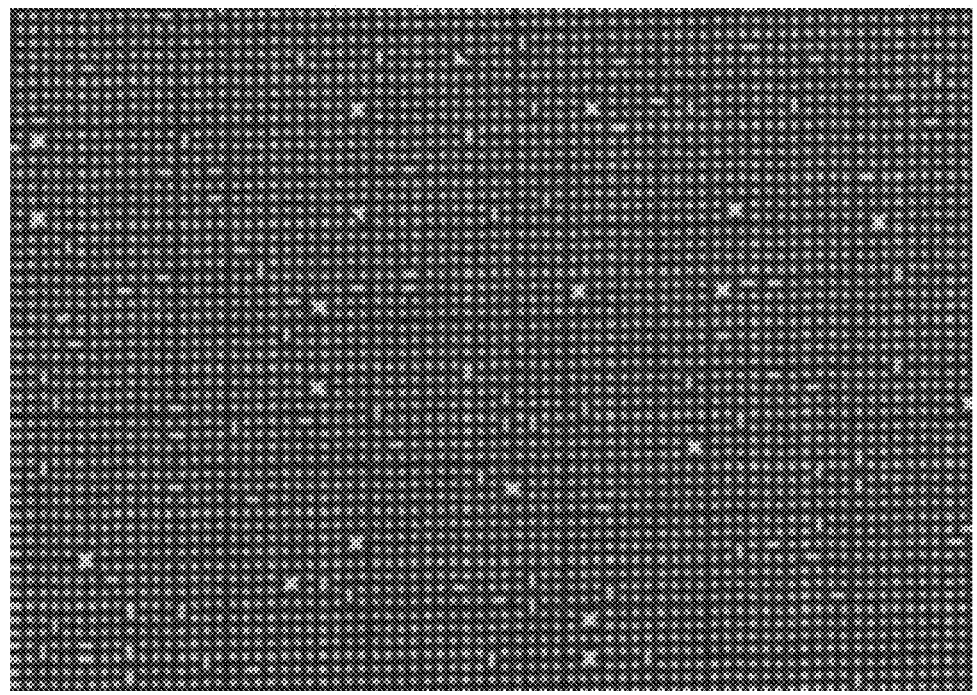
FIG. 24 is an SEM image showing the pattern formation surface of a silicon substrate on which substrate processing according to example 7 of the present invention was performed.

FIG. 24 is an SEM image of the silicon substrate after the steps from the application of ultraviolet rays to the removal step were performed (magnification: 20,000 times). As compared with the pattern formation surface of the silicon substrate before the drying processing (see FIG. 23), the collapse of the pattern was hardly found, and the collapse rate in the displayed region was about 10%. In this way, it is confirmed that when the liquid film of the process liquid is thinned, the collapse of the pattern can be extremely satisfactorily inhibited while the evaporation of the process liquid is prevented.

Example 8

In the present example, the flow rate of the dry nitrogen gas in the atmosphere control step was changed to 0 l/min. The clearance between the silicon substrate and the interruption plate was set to 41 mm. Except for these, the drying processing was performed on the pattern formation surface of the silicon substrate as was in example 7.

Figure 25:
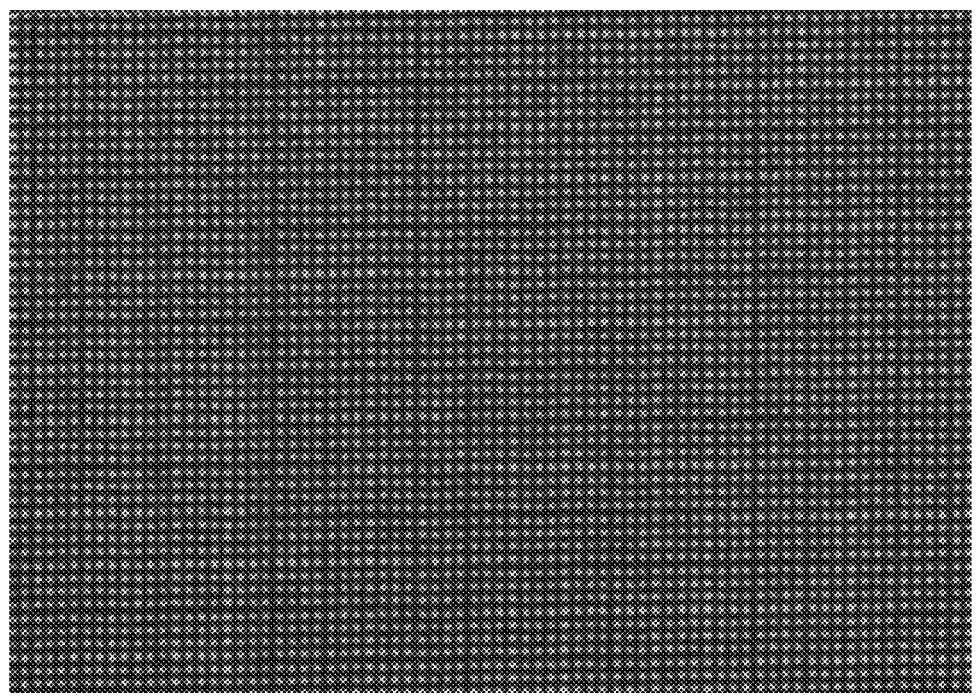
FIG. 25 is an SEM image showing the pattern formation surface of a silicon substrate on which substrate processing according to example 8 of the present invention was performed.

FIG. 25 is an SEM image of the pattern formation surface of the silicon substrate after the drying processing according to the present example was performed (magnification: 20,000 times). As compared with the pattern formation surface of the silicon substrate before the drying processing (see FIG. 23), the collapse of the pattern was significantly reduced, and the collapse rate in the displayed region was about 1%. Furthermore, it is confirmed that, as compared with example 7, the collapse rate of the pattern around the center of the pattern formation surface of the silicon substrate was further reduced. In this way, it is confirmed that, in the atmosphere control step, as compared with the case where the dry nitrogen gas is sprayed to the pattern formation surface of the silicon substrate, the collapse of the pattern is further more reduced while the evaporation of the process liquid is prevented.

The present invention can be applied to a drying technology for removing liquid adhered to the front surface of a substrate as well as a substrate processing technology as a whole for processing the front surface of the substrate using the drying technology.

What is claimed is:

1. A substrate treating method comprising:
a supply step of supplying a process liquid including a drying auxiliary substance in a melted state to a pattern formation surface of a substrate;
a solidification step of solidifying the process liquid on the pattern formation surface so as to from a solidified body; and
a removal step of removing the solidified body from the pattern formation surface,
wherein a substance which satisfies at least one of the following conditions, namely a melting entropy under atmospheric pressure at a melting point of 1 $mJ/cm^3 \cdot K$ or more but 500 $mJ/cm^3 \cdot K$ or less and a sublimation entropy under atmospheric pressure at 0° C. of 1 $mJ/cm^3 \cdot K$ or more but 2000 $mJ/cm^3 \cdot K$ or less, is used as the drying auxiliary substance,
the substrate treating method further comprising an atmosphere control step of placing at least the pattern formation surface of the substrate under a dry inert gas atmosphere containing 1000 ppm or less of water or making the dry inert gas containing 1000 ppm or less of water flow from the center of the pattern formation surface of the substrate toward a freely-selected peripheral portion, thereby replacing air located on the pattern formation surface with the dry inert gas so as to perform atmosphere control on the pattern formation surface,
wherein the atmosphere control step is performed in parallel with the supply step.

2. The substrate treating method according to claim 1, further comprising:

a film thinning step of thinning, on the pattern formation surface, a liquid film of the process liquid supplied to the pattern formation surface of the substrate in the supply step, wherein the atmosphere control step is performed in parallel with the film thinning step instead of the supply step or in parallel with the supply step and the film thinning step.

3. The substrate treating method according to claim 1, wherein the flow of the dry inert gas from the center of the pattern formation surface of the substrate toward the freely-selected peripheral portion in the atmosphere control step is made to be a laminar flow with a flow rate of 30 l/min or less.

4. The substrate treating method according to claim 1, wherein the drying auxiliary substance is one selected from a group consisting of 1, 1, 2, 2, 3, 3, 4-heptafluorocyclopentane, p-xylene, cyclohexane, hexafluorobenzene, dodecafluorocyclohexane and fluorocyclohexane.

5. The substrate treating method according to claim 1, wherein the dry inert gas is at least one selected from a group consisting of nitrogen gas, dry air, argon gas and carbon dioxide.

6. The substrate treating method according to claim 1, wherein the dry inert gas contains 100 ppm or less of water.

7. The substrate treating method according to claim 6, wherein the dry inert gas contains 10 ppm or less of water.

* * * * *